(12) United States Patent
Shimoyama et al.

(10) Patent No.: US 9,995,642 B2
(45) Date of Patent: Jun. 12, 2018

(54) CANTILEVER PRESSURE SENSOR WITH DIVISION PORTIONS FOR DIVIDING LEVER RESISTANCE AND HAVING PIEZORESISTOR ELEMENT

(71) Applicants: THE UNIVERSITY OF TOKYO, Tokyo (JP); SEIKO INSTRUMENTS INC., Chiba-shi, Chiba (JP)

(72) Inventors: Isao Shimoyama, Tokyo (JP); Kiyoshi Matsumoto, Tokyo (JP); Hidetoshi Takahashi, Tokyo (JP); Minh-Dung Nguyen, Tokyo (JP); Takeshi Uchiyama, Chiba (JP); Manabu Oumi, Chiba (JP); Yoko Shinohara, Chiba (JP); Masayuki Suda, Chiba (JP)

(73) Assignees: THE UNIVERSITY OF TOKYO, Tokyo (JP); SEIKO INSTRUMENTS INC., Chiba-shi (JP)

( * ) Notice: Subject to any disclaimer, the term of this patent is extended or adjusted under 35 U.S.C. 154(b) by 0 days. days.

(21) Appl. No.: 15/512,701

(22) PCT Filed: Sep. 28, 2015

(86) PCT No.: PCT/JP2015/077294
§ 371 (c)(1),
(2) Date: Mar. 20, 2017

(87) PCT Pub. No.: WO2016/056419
PCT Pub. Date: Apr. 14, 2016

(65) Prior Publication Data
US 2017/0292877 A1  Oct. 12, 2017

(30) Foreign Application Priority Data

Oct. 6, 2014 (JP) ................. 2014-205890

(51) Int. Cl.
*G01L 1/18* (2006.01)
*G01L 1/22* (2006.01)

(52) U.S. Cl.
CPC .............. *G01L 1/18* (2013.01); *G01L 1/2206* (2013.01)

(58) Field of Classification Search
CPC ........ G01L 1/18; G01L 1/2206; G01L 9/0054
See application file for complete search history.

(56) References Cited

U.S. PATENT DOCUMENTS 5,908,981 A * 6/1999 Atalar ................... G01Q 20/02
356/501
7,136,215 B1 * 11/2006 Machida ............ G02B 26/0858
359/295

(Continued)

FOREIGN PATENT DOCUMENTS

JP  H04-93632 A  3/1992
JP  H04-208827 A  7/1992

(Continued)

OTHER PUBLICATIONS

Oct. 20, 2015 International Search Report issued in International Patent Application No. PCT/JP2015/077294.

(Continued)

*Primary Examiner* — Harshad R Patel
*Assistant Examiner* — Jamel Williams
(74) *Attorney, Agent, or Firm* — Oliff PLC

(57) ABSTRACT

A pressure sensor includes a sensor main body having a cavity, a cantilever having a lever main body and lever support-portion, which is bent according to a pressure difference between the cavity and sensor outside main body, and a displacement detection unit detects cantilever displacement based on resistance variation in resistance values of the main body-resistance portion formed in the lever main (Continued)

body and lever-resistance portion formed in the lever support-portion. A division groove is formed in the lever support; the division divides the lever-resistance portion into a first resistance portion electrically connected to a detection-electrode in series and second resistance portion closer to other adjacent lever support-portion than the first resistance portion. The first resistance portion of the lever support-portion electrically connected to the detection-electrode via a parallel path of a first path passing through the main body-resistance portion and second path passing through the second resistance portion.

11 Claims, 23 Drawing Sheets

(56) References Cited

U.S. PATENT DOCUMENTS

| | | | | |
|---|---|---|---|---|
| 2003/0027351 | A1* | 2/2003 | Manalis | G01N 21/41 436/165 |
| 2005/0210988 | A1* | 9/2005 | Amano | G06K 9/0002 73/704 |
| 2007/0145966 | A1* | 6/2007 | Shekhawat | G01N 29/036 324/71.1 |
| 2007/0209437 | A1* | 9/2007 | Xue | B81B 3/0032 73/514.31 |
| 2009/0019948 | A1 | 1/2009 | Jager | |
| 2010/0218288 | A1* | 8/2010 | Sarioglu | G01Q 20/02 850/33 |
| 2013/0247676 | A1* | 9/2013 | Uchiyama | G01L 9/0019 73/721 |
| 2013/0247677 | A1* | 9/2013 | Uchiyama | G01L 13/02 73/721 |
| 2015/0096388 | A1* | 4/2015 | Shimoyama | G01L 13/06 73/862.627 |
| 2015/0362394 | A1* | 12/2015 | Shimoyama | G01L 9/0001 73/702 |
| 2016/0349130 | A1* | 12/2016 | Shimoyama | G01L 9/0002 |
| 2017/0276563 | A1* | 9/2017 | Shinohara | G01O 5/06 |
| 2017/0292877 | A1* | 10/2017 | Shimoyama | G01L 1/2206 |

FOREIGN PATENT DOCUMENTS

| | | | | |
|---|---|---|---|---|
| JP | 06324074 | A | * 11/1994 | |
| JP | 2003156510 | A | * 5/2003 | |
| JP | 2005249785 | A | * 9/2005 | G01L 1/16 |
| JP | 2008139136 | A | * 6/2008 | |
| JP | 2013-234853 | A | 11/2013 | |
| JP | 5650360 | B1 | 1/2015 | |
| JP | 5674167 | B2 | 2/2015 | |
| WO | 2012/102073 | A1 | 8/2012 | |
| WO | 2015/137159 | A1 | 9/2015 | |
| WO | 2015/137160 | A1 | 9/2015 | |
| WO | 2015/198414 | A1 | 12/2015 | |

OTHER PUBLICATIONS

Aug. 8, 2017 Notice of Allowance issued in Japanese Patent Application No. 2016-553051.
Feb. 7, 2018 Extended European Search Report issued in European Patent Application No. 15849018.5.

* cited by examiner

CANTILEVER PRESSURE SENSOR WITH DIVISION PORTIONS FOR DIVIDING LEVER RESISTANCE AND HAVING PIEZORESISTOR ELEMENT

TECHNICAL FIELD

The present invention relates to a pressure sensor.
Priority is claimed on Japanese Patent Application No. 2014-205890, filed on Oct. 6, 2014, the content of which is incorporated herein by reference.

BACKGROUND ART

In the related art, for example, as a pressure sensor (differential pressure sensor) which detects variation in pressures, a pressure sensor is known which includes an accommodation container having a vent hole, a substrate which is disposed in the accommodation container and has a through-hole or a recessed portion, and a piezoelectric element which is supported to the substrate in a cantilever manner so as to be vibrated in the through-hole or the recessed portion (refer to PTL 1).

By the pressure sensor, the piezoelectric element is vibrated according to a magnitude of a pressure difference between variation in the pressures transmitted to the accommodation container via the vent hole, and a pressure inside the through-hole or the recessed portion following a delay from the variation in the pressures. As a result, the pressure sensor can detect the variation in the pressures transmitted to the accommodation container based on variation in voltages generated in the piezoelectric element.

CITATION LIST

Patent Literature

[PTL 1] Japanese Unexamined Patent Application, First Publication No. H4-208827

SUMMARY OF INVENTION

Technical Problem

Detection sensitivity of the pressure sensor in the related art is determined by the shape of the piezoelectric element, the volume of the through-hole or the recessed portion, a flow rate between the through-hole or the recessed portion and the outside air, or the like, and particularly, the detection sensitivity of the pressure sensor is easily influenced by the shape of the piezoelectric element. However, since the piezoelectric element is configured of a double-sided electrode structure having electrode films or the like on both surfaces of the piezoelectric substance, the thickness of the piezoelectric element increases due to the structure thereof, and it is difficult to secure great deformation. Accordingly, it is difficult to increase the sensitivity while decreasing a resonance frequency, and for example, it is difficult to secure desired sensitivity in a low frequency band such as 1 Hz or less.

The present invention is made in consideration of the above-described circumstances, and an object thereof is to provide a pressure sensor capable of accurately detecting variation in pressures and sensitively detecting the variation in pressures.

Solution to Problem (1) According to an aspect of the present invention, a pressure sensor is provided, including: a hollow sensor main body having a cavity formed therein and having a communication opening through which the inside and the outside of the cavity communicate with each other; a cantilever having a lever main body and a plurality of lever support portions which connect the lever main body and the sensor main body and support the lever main body in a cantilever state, is disposed so as to cover the communication opening, and is bent according to a pressure difference between the cavity and the outside of the sensor main body; and a displacement detection unit having a detection electrode formed on the sensor main body, a main body-resistance portion formed on the lever main body, and a lever-resistance portion formed on the lever support portion, and detects displacement of the cantilever based on resistance variation in resistance values of the main body-resistance portion and the lever-resistance portion. A division portion is formed at the lever support portion, and the division portion divides the lever-resistance portion into a first resistance portion which is electrically connected to the detection electrode in series and a second resistance portion which is positioned so as to be closer to the other adjacent lever support portion than the first resistance portion, and electrically separates the first resistance portion and the second resistance portion from each other. The first resistance portion is electrically connected to the detection electrode via a parallel path of a first path passing through the main body-resistance portion and a second path passing through the second resistance portion.

According to the pressure sensor of the present invention, the pressure difference is generated between the inside and the outside of the cavity if the pressure outside the sensor is changed, and the cantilever is bent according to the pressure difference. After the deformation, since a pressure transmission medium flows to a portion between the inside and the outside of the cavity through a gap between the cantilever and the communication opening with the lapse of time, the pressures inside and outside the cavity gradually balance with each other. Accordingly, bending of the cantilever gradually decreases, and finally, is deformed so as to be returned to the original state. Accordingly, since the displacement (bending displacement) of the cantilever is detected by the displacement detection unit, it is possible to detect the variation in pressures from the detection result.

Specifically, the displacement detection unit detects the displacement of the cantilever based on the resistance variation in resistance values of the main body-resistance portion formed on the lever main body and the lever-resistance portion formed on the lever support portion. In this case, the lever-resistance portion is divided into the first resistance portion and the second resistance portion by the division portion. In addition, the first resistance portion is electrically connected to the detection electrode via the parallel path of the first path passing through the main body-resistance portion and the second path passing through the second resistance portion.

Accordingly, the displacement detection unit detects the displacement of the cantilever based on the resistance variation in resistance value of the first path and the resistance variation in resistance value of the second path.

Since the cantilever is bent as the plurality of lever support portions, which support the lever main body in a cantilever state, with a center, the plurality of lever support portions are more positively displaced than the lever main body. Accordingly, a stress detection portion which greatly contributes to the sensitivity becomes the first resistance portion and the second resistance portion in the lever support portion. In contrast, the main body-resistance portion in the lever main body becomes the stress detection portion having a small contribution degree (contribution margin) with respect to the sensitivity.

Accordingly, since the lever-resistance portion is divided into the first resistance portion and the second resistance portion by the division portion and the first resistance portion is electrically connected to the detection electrode via the parallel path of the first path and the second path, it is possible to positively use the second resistance portion which greatly contributes to the sensitivity while decreasing influences of the main body-resistance portion having a small contribution margin with respect to the sensitivity if possible.

That is, since the resistance between the detection electrodes can be decreased and a ratio of the resistance of the first resistance portion with respect to the entire resistance between the detection electrodes can be increased by configuring the parallel path, it is possible to increase the sensitivity.

Accordingly, it is possible to sensitively detect the displacement of the cantilever. Therefore, it is possible to improve the sensitivity of the sensor, and the sensor can be a highly efficient pressure sensor capable of accurately detecting the variation in pressures. As a result, for example, it is possible to sensitively detect the variation in pressures of a low frequency band such as 1 Hz or less, and it is possible to decrease a low limit frequency which can be detected.

(2) The division portion may be formed in each of the adjacent lever support portions, and the first resistance portions of the adjacent lever support portions may be electrically connected to the detection electrode in a state of being electrically connected to each other by the parallel path of the first path passing through the main body-resistance portion and the second path passing through the second resistance portion and the base end portion side of the cantilever.

In this case, the displacement detection unit detects the displacement of the cantilever based on the resistance variation in resistance values of the first path (the resistance variation in resistance values of the first resistance portion of one lever support portion, the main body-resistance portion, and the first resistance portion of the other lever support portion), and the resistance variation in resistance values of the second path (the resistance variation in resistance values of the first resistance portion and the second resistance portion of the one lever support portion, and the first resistance portion and the second resistance portion of the other lever support portion).

In this way, since the first resistance portions of the adjacent lever support portions are electrically connected to each other by two parallel paths of the first paths and the second paths, it is possible to positively use the second resistance portion which greatly contributes to the sensitivity while decreasing influences of the main body-resistance portion having a small contribution margin with respect to the sensitivity if possible. That is, since the resistance between the detection electrodes can be decreased and a ratio of the resistance of the first resistance portion with respect to the entire resistance between the detection electrodes can be increased by configuring the parallel path, it is possible to increase the sensitivity.

Particularly, since the first resistance portions of the adjacent lever support portions are electrically connected to each other by the parallel path of the first path and the second path, it is possible to select a plurality of methods with respect to improvement of sensitivity according to contrivances of both paths.

For example, since it is possible to increase the influences of the first resistance portion which is connected to the detection electrode in series by the contrivance of the second path side if possible, it is possible to increase a ratio of the resistance of the first resistance portion with respect to the entire resistance between the detection electrodes, and it is possible to increase the sensitivity. In addition, since the resistance value of the main body-resistance portion is increased by the contrivance of the first path side, the sensitivity of the parallel path portion which electrically connects the first resistance portions to each other is increased by increasing the influences of the second resistance portion which greatly contributes to the sensitivity, and as a result, it is possible to increase the entire sensitivity between the detection electrodes.

In this way, since it is possible to select a plurality of methods with respect to the sensitivity improvement, it is possible to increase a degree of freedom in design, and the pressure sensor can be easily used for various purposes.

(3) The division portion may divide the first resistance portion and the second resistance portion such that a first width of the first resistance portion along a support width of the lever support portion is narrower than a second width of the second resistance portion along a support width of the lever support portion.

In this case, since the resistance value of the first resistance portion can be larger than the resistance value of the second resistance portion, it is possible to further increase a ratio of the resistance of the first resistance portion connected to the detection electrode in series with respect to the entire resistance between the detection electrodes. Accordingly, it is possible to further improve the sensitivity of the sensor.

(4) The division portion may be a groove-shaped division groove which is formed at lever-resistance portion.

In this case, for example, since the division groove is formed by grooving or the like after the lever-resistance portion is formed, it is possible to easily form the division groove in a state where the first resistance portion and the second resistance portion are electrically separated from each other reliably. Accordingly, it is possible to more effectively manufacture the pressure sensor.

(5) A conductor having electric resistivity which is smaller than that of the first resistance portion may be formed in the second resistance portion.

In this case, since the resistance value of the second resistance portion can be smaller than the resistance value of the first resistance portion, it is possible to further increase the ratio of the resistance of the first resistance portion with respect to the entire resistance between the detection electrodes by relatively increasing the resistance value of the first resistance portion. Accordingly, it is possible to further improve the sensitivity of the sensor.

(6) A resistance-increase portion which increases a resistance of the main body-resistance portion may be formed in the main body-resistance portion.

In this case, since the resistance value of the main body-resistance portion can be increased in the lever main body, it is possible to preferentially use the second path than the first path, and it is possible to increase the influences of the second resistance portion which greatly contributes to sensitivity. Accordingly, for example, it is possible to increase the sensitivity of the parallel path portion which electrically connects the first resistance portions to each other, and it is possible to increase the entire sensitivity between the detection electrodes. As a result, it is possible to further improve the sensitivity of the sensor.

(7) The resistance-increase portion may be a groove-shaped groove portion which is formed at the main body-resistance portion and is formed so as to increase a transmission distance of a current which flows through the main body-resistance portion.

In this case, since it is possible to increase the transmission distance of the current flowing through the main body-resistance portion, it is possible to increase the resistance value of the main body-resistance portion as the transmission distance increases. In addition, for example, since the groove portion is easily formed by grooving or the like after the main body-resistance portion is formed, it is possible to easily improve manufacturing efficiency of the pressure sensor.

(8) The resistance-increase portion may a groove-shaped groove portion which is formed at the main body-resistance portion and is formed so as to interrupt a flow of a current which flows through the main body-resistance portion.

In this case, since the flow of the current which flows through the main body-resistance portion can be interrupted, it is possible to increase the resistance value of the main body-resistance portion as the flow of the current is interrupted. Moreover, for example, since the groove portion is easily formed by grooving or the like after the main body-resistance portion is formed, it is possible to easily improve manufacturing efficiency of the pressure sensor.

(9) The resistance-increase portion may be an insulation layer.

In this case, for example, since it is not necessary to perform grooving or drilling to increase the resistance of the main body-resistance portion by machining the main body-resistance portion and the insulation layer may be formed using a semiconductor manufacturing technology or the like, it is possible to prevent rigidity of the cantilever from being decreased due to machining, and it is possible to easily manufacture the pressure sensor having a high quality. In addition, since the machining is not required, it is possible to improve manufacturing efficiency of the pressure sensor.

(10) A base end-resistance portion which is formed between the adjacent lever support portions and a resistance-adjustment portion which adjusts a resistance of the base end resistance portion may be provided in the base end portion of the cantilever.

In this case, since it is possible to adjust the resistance (electric resistance value) of the base end resistance portion, it is possible to adjust the resistance ratio of the second resistance portion which greatly contributes to the sensitivity. Accordingly, for example, the influences of the first resistance portion which is electrically connected to the detection electrode in series are adjusted to be increased, the resistance ratio of the first resistance portion with respect to the entire resistance between the detection electrodes is increased, and it is possible to improve the sensitivity of the sensor. Alternatively, the influences of the second resistance portion are adjusted to be increased, the sensitivity of the entire second path increases, and it is possible to improve the entire sensitivity between the detection electrodes.

In this way, for example, it is possible to adjust the entire electric resistance value between the first resistance portions which are electrically connected to each other by two parallel paths such as the first path and the second path. Accordingly, it is possible to not only perform the adjustment of sensitivity but also a balance adjustment with respect to a bridge circuit included in the displacement detection unit or the like.

(11) The pressure sensor may further include a reference portion which is disposed so as to be exposed to the outside of the sensor main body and in which a reference-resistance portion is formed, in which the displacement detection unit may detect displacement of the cantilever based on a difference between the resistance variation in resistance values of the main body-resistance portion and the lever-resistance portion and the resistance variation in resistance values of the reference-resistance portion.

In this case, it is possible to cancel out variation in sensitivity generated due to an environment change such as a temperature change or disturbance such as vibrations, and it is possible to more accurately detect the variation in pressures.

Advantageous Effects of Invention

According to the pressure sensor of the present invention, it is possible to accurately detect variation in pressures, and it is possible to sensitively detect the variation in pressures.

DESCRIPTION OF EMBODIMENTS

First Embodiment

Hereinafter, a first embodiment of a pressure sensor according to the present invention will be described with reference to the drawings.

Figure 1:
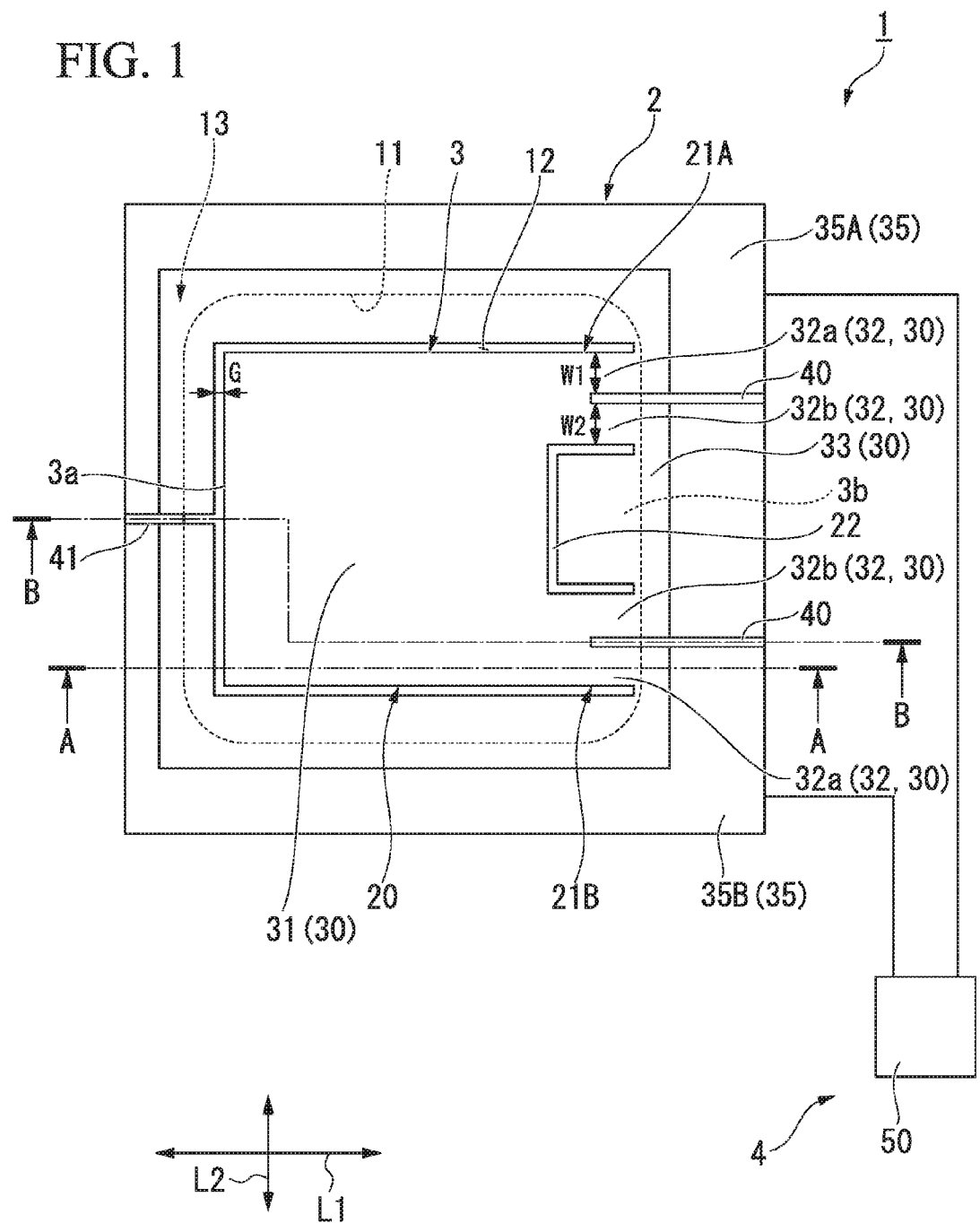
FIG. 1 is a view showing a first embodiment according to the present invention and is a plan view of a pressure sensor.
Figure 2:
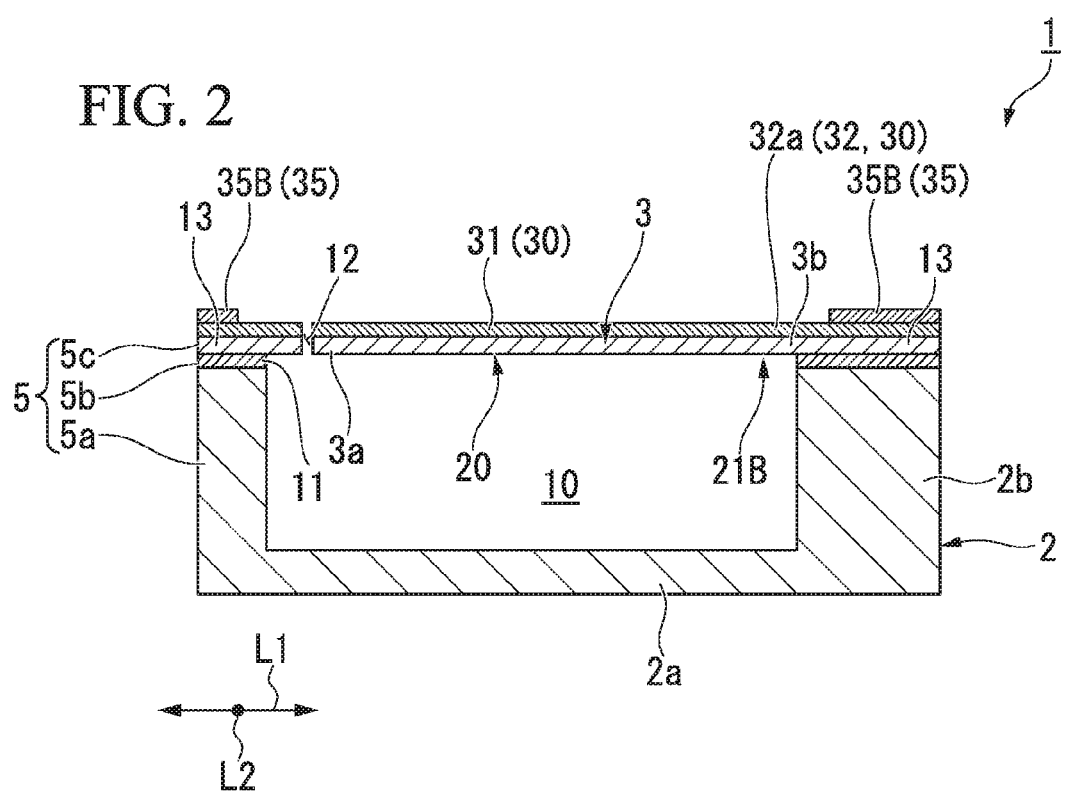
FIG. 2 is a sectional view showing the pressure sensor taken along a line A-A shown in FIG. 1.
Figure 3:
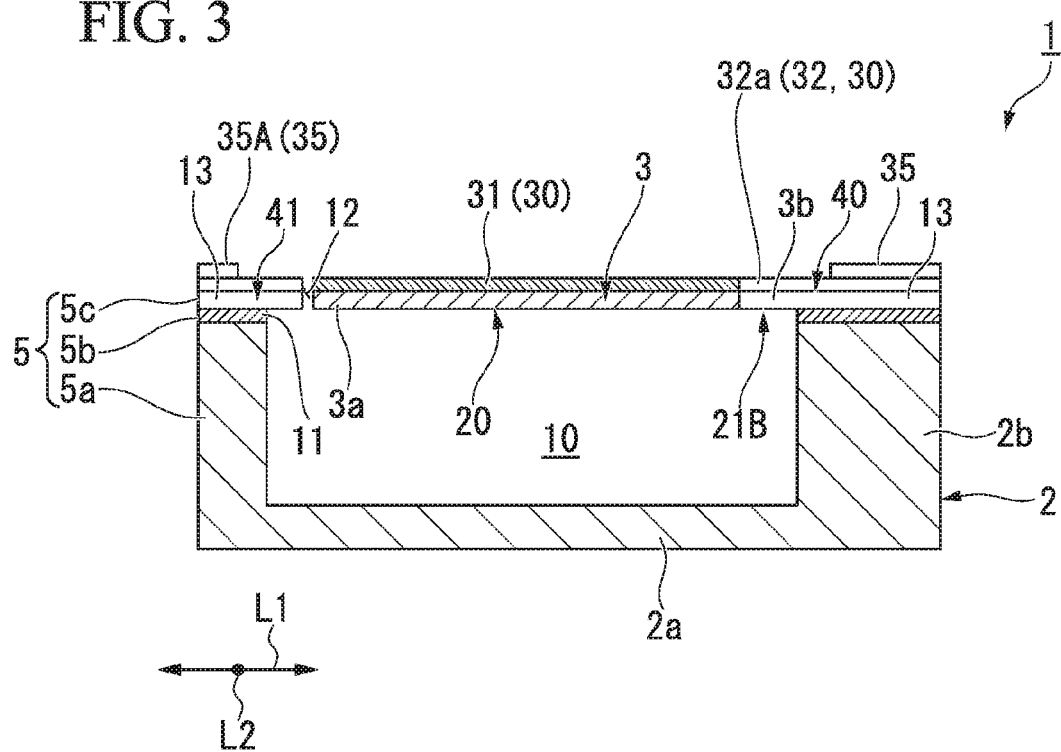
FIG. 3 is a sectional view showing the pressure sensor taken along a line B-B shown in FIG. 1.

As shown in FIGS. 1 to 3, a pressure sensor 1 of the present embodiment is a sensor which detects variation in pressures of a predetermined frequency band, and is disposed and used in a space in which a pressure transmission medium (for example, gas such as air) exists, or the like.

For example, the pressure sensor 1 includes a sensor main body 2 which is formed using a SOI substrate 5 and has a rectangular outline, a cantilever 3 in which a tip portion 3a is a free end and a base end portion 3b is supported in a cantilever manner, and a displacement detection unit 4 which detects displacement (bending displacement) of the cantilever 3.

In addition, in the present embodiment, the cantilever 3 side in the thickness direction of the pressure sensor 1 is referred to as an upper side, the side opposite to the upper side referred to as a lower side, a vertical direction (longitudinal direction) in plan view of the pressure sensor 1 is referred to as L1 (hereinafter, referred to as a vertical direction L1), and a lateral direction (transverse direction) orthogonal to the vertical direction L1 in plan view of the pressure sensor 1 is referred to as L2 (hereinafter, referred to as a lateral direction L2).

In addition, the SOI substrate 5 is formed by thermally bonding a silicon support layer 5a, an electrically insulating oxide layer 5b such as a silicon oxide film, and a silicon active layer 5c.

For example, the sensor main body 2 is formed of the silicon support layer 5a in the SOI substrate 5. Specifically, the sensor main body 2 includes a bottom wall portion 2a and a peripheral wall portion 2b, and is formed in a bottomed tubular shape which is open to the upper side. An internal space of the sensor main body 2 functions as a cavity (air chamber) 10, and the portion which is open to the upper side functions as a communication opening 11 which communicates with the inner side and the outside of the cavity 10.

The oxide layer 5b is formed in an annular shape over the entire circumference on the opening end edge of the peripheral wall portion 2b of the sensor main body 2. The silicon active layer 5c is formed on the oxide layer 5b so as to cover the sensor main body 2 from the upper side. A gap 12 which penetrates the silicon active layer 5c in the thickness direction and is formed in a C shape in plan view is formed in the silicon active layer 5c. Accordingly, an annular frame portion 13 and the cantilever 3 are formed in the silicon active layer 5c.

The gap 12 is formed in a region (in a region which communicates with the inside of the cavity 10) positioned inside the communication opening 11 in plan view, and for example, a gap width G is a minute width of several hundred nanometers to several tens of micrometers.

In the cantilever 3, the base end portion 3b is integrally connected to the inside of the opening end of the peripheral wall portion 2b in the sensor main body 2 via the frame portion 13, and the tip portion 3a has a cantilever structure of a free end and is disposed so as to cover the communication opening 11.

In addition, the frame portion 13 is formed in an annular shape over the entire circumference on the oxide layer 5b, and a portion of the frame portion 13 protrudes toward the cantilever 3 side from the peripheral wall portion 2b so as to cover the communication opening 11. Accordingly, a portion of the frame portion 13 covers the communication opening 11.

A cantilever 3 will be described in detail.

The cantilever 3 includes a lever main body 20 and two lever support portions 21A and 21B which support the lever main body 20 in a cantilever state. In addition, the cantilever 3 is bent according to a pressure difference (that is, a pressure difference due to a pressure transmission medium which can flow between the inside and the outside of the cavity 10 via the gap 12) of the inside and the outside of the cavity 10 with the base end portion 3b as a center.

An auxiliary gap 22 which penetrates the cantilever 3 in the thickness direction and is formed in C shape is formed in the base end portion 3b of the cantilever 3. The auxiliary gap 22 is disposed at the center portion of the pressure sensor 1 in the lateral direction L2 on the base end portion 3b of the cantilever 3. Accordingly, the cantilever 3 is easily bent with the base end portion 3b as a center.

The two lever support portions 21A and 21B are disposed so as to be arranged in the lateral direction L2 in a state where the auxiliary gap 22 is interposed therebetween, connect the lever main body 20 and the frame portion 13, and support the lever main body 20 in a cantilever state. Accordingly, the cantilever 3 is bent with the lever support portions 21A and 21B as a center.

In addition, the support widths of the two lever support portions 21A and 21B in the lateral direction L2 are the same as each other. Accordingly, when the cantilever 3 is bent, stress per unit area applied to one lever support portion 21A is the same as stress per unit area applied to the other lever support portion 21B.

In the silicon active layer 5c in which the above-described cantilever 3 and frame portion 13 are formed, a piezoresistance (resistance element) 30 is formed over the entire surface of the silicon active layer 5c. For example, the piezoresistance 30 is formed by doping a doping agent (impurities) such as phosphorus using various methods such as an ion implantation method or a diffusion method.

The portion of the piezoresistance 30 which is formed on the lever main body 20 functions as a main body-resistance portion 31 in which the resistance value is changed according to the bending amount of the lever main body 20. In addition, each of the portions of the piezoresistance 30 which are formed on the lever support portions 21A and 21B functions as a lever-resistance portion 32 in which the resistance value is changed according to the bending amount of each of the lever support portions 21A and 21B. In addition, the portion of the piezoresistance 30 which is formed between the two lever support portions 21A and 21B on the base end portion 3b side of the cantilever 3 functions as a base end-resistance portion 33.

In addition, a detection electrode 35 configured of a conductive material (for example, AU or the like) having electric resistivity which is smaller than that of the piezoresistance 30 is formed on the upper surface of the piezoresistance 30. The detection electrode 35 is formed in a frame shape in plan view which surrounds the cantilever 3 and is disposed on the frame portion 13.

Moreover, preferably, an insulating film (not shown) is coated on the upper surface of each of the piezoresistance 30 and the detection electrode 35 as a protection film so as to prevent the piezoresistance 30 and the detection electrode 35 from coming into electric-contact with the outside.

In each of the lever support portions 21A and 21B, a division groove (division portion) 40 is formed, which divides the lever-resistance portion 32 into a first resistance portion 32a and a second resistance portion 32b so as to electrically separate the first resistance portion 32a and the second resistance portion 32b from each other.

Here, the division groove 40 which is formed on the one lever support portion 21A will be described in detail.

The division groove 40 is disposed at the center portion in the lateral direction L2 in the lever support portion 21A, and is formed to linearly extend in the vertical direction L1. In this case, the division groove 40 linearly extends from the center portion of the lever support portion 21A in the vertical direction L1 toward the base end portion 3b of the cantilever 3, and is formed to reach the side of the sensor main body 2 so as to divide the detection electrode 35 in the lateral direction L2.

In this way, since the division groove 40 is formed, the lever-resistance portion 32 is divided in the lateral direction L2, and the first resistance portion 32a and the second resistance portion 32b which is positioned to be closer to the other lever support portion 21B than the first resistance portion 32a are electrically separated from each other.

Moreover, since the division groove 40 is disposed at the center portion of the lever support portion 21A in the lateral direction L2, a first width W1 of the first resistance portion 32a in the lateral direction L2 and a second width W2 of the second resistance portion 32b in the lateral direction L2 are the same as each other.

In addition, in the shown example, the division groove 40 has a depth which reaches the oxide layer 5b. However, the present invention is not limited to this, and for example, the division groove 40 may penetrate the cantilever 3 in the thickness direction. In any case, preferably, the division groove 40 is formed to have a depth which reaches at least the oxide layer 5b. In addition, the division groove 40 may further extend toward the lever main body 20 side from the intermediate portion of the lever support portion 21A in the vertical direction L1.

Similarly to the above-described, the division groove 40 is formed in the other lever support portion 21B. Accordingly, the lever-resistance portion 32 of the other lever support portion 21B is divided into the first resistance portion 32a and the second resistance portion 32b which is positioned to be closer to the lever support portion 21A than the first resistance portion 32a so as to be electrically separated from each other by the division groove 40.

As described above, the division groove 40 which is formed on each of the two lever support portions 21A and 21B is formed to reach the side of the sensor main body 2 so as to divide the detection electrode 35 in the lateral direction L2. Accordingly, the detection electrode 35 is electrically separated in the lateral direction L2 in a state where the division groove 40 is interposed therebetween.

The portion of the detection electrode 35 which is positioned on the first resistance portion 32a side in the one lever support portion 21A functions as a first detection electrode 35A which is electrically connected to the first resistance portion 32a in series. In addition, the portion of the detection electrode 35 which is positioned on the first resistance portion 32a side in the other lever support portion 21B functions as a second detection electrode 35B which is electrically connected to the first resistance portion 32a in series.

Moreover, an electrode groove 41 which electrically separates the first detection electrode 35A and the second detection electrode 35B from each other is formed on the portion which is positioned on the tip portion 3a side of the cantilever 3 in the frame portion 13. The electrode groove 41 is formed to linearly extend in the vertical direction L1 between the gap 12 and the side of the sensor main body 2, and for example, has a depth which reaches the oxide layer 5b.

A detection circuit 50 which detects the displacement of the cantilever 3 based on resistance variation in resistance values of the main body-resistance portion 31 and the lever-resistance portion 32 is connected to the first detection electrode 35A and the second detection electrode 35B which are electrically separated from each other.

Accordingly, if the a predetermined voltage is applied between the first detection electrode 35A and the second detection electrode 35B through the detection circuit 50, a current due to the applied voltage flows from the first detection electrode 35A to the second detection electrode 35B passing through the first resistance portion 32a of the one lever support portion 21A and the first resistance portion 32a of the other lever support portion 21B.

Accordingly, the detection circuit 50 can extract the resistance variation in the entire electric resistance value R between the first detection electrode 35A and the second detection electrode 35B as an electric output signal (sensor signal) which is changed according to the displacement (displacement according to the bending) of the cantilever 3. Accordingly, it is possible to detect the displacement of the cantilever 3 based on the output signal and it is possible to detect the variation in pressures.

Accordingly, the detection electrode 35, the main body-resistance portion 31, the lever-resistance portion 32, and the detection circuit 50 function as the displacement detection unit 4 which detects the displacement of the cantilever 3 based on the resistance variation in the resistance value of the electric resistance value R between the first detection electrode 35A and the second detection electrode 35B.

Particularly, the lever-resistance portion 32 in each of the two lever support portions 21A and 21B is divided into the first resistance portion 32a and the second resistance portion 32b.

Figure 4:
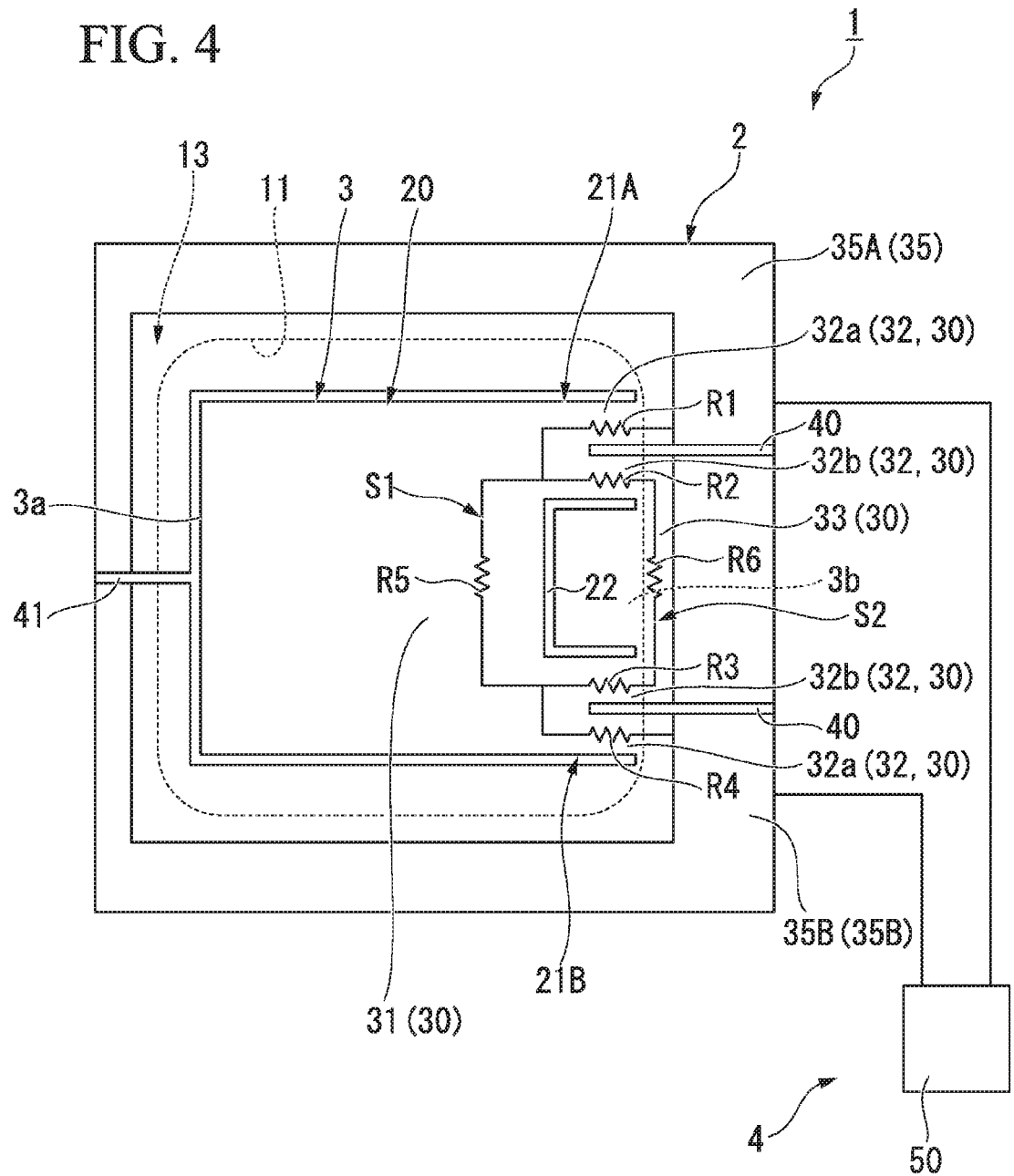
FIG. 4 is a connection circuit configuration view of respective resistances in the pressure sensor shown in FIG. 1.

Accordingly, as shown in FIG. 4, the first resistance portions 32a of the two lever support portions 21A and 21B are electrically connected to each other by a parallel path of a first path S1 passing through the main body-resistance portion 31 and a second path S2 passing through the second resistance portion 32b and the base end-resistance portion 33.

Accordingly, the electric resistance value R between the first detection electrode 35A and the second detection electrode 35B is expressed by the following Expression 1.

In addition, the first resistance portion 32a in the one lever support portion 21A is electrically connected to a portion between the first detection electrode 35A and the second detection electrode 35B via the parallel path of the first path S1 and the second path S2. This is similarly applied to the first resistance portion 32a in the other lever support portion 21B.

$$R = R1 + R4 + \frac{1}{\frac{1}{R5} + \frac{1}{R2 + R3 + R6}}$$ Expression 1

In Expression 1, R1 indicates the electric resistance value of the first resistance portion 32a in the one lever support portion 21A. R2 indicates the electric resistance value of the second resistance portion 32b in the one lever support portion 21A. R3 indicates the electric resistance value of the second resistance portion 32b in the other lever support portion 21B. R4 indicates the electric resistance value of the first resistance portion 32a in the other lever support portion 21B. R5 indicates the electric resistance value of the main body-resistance portion 31. R6 indicates the electric resistance value of the base end-resistance portion 33.

In addition, since the first resistance portions 32a in the lever support portions 21A and 21B are connected in series with respect to the first detection electrode 35A and the second detection electrode 35B, as is evident from Expression 1, the resistance variation in the electric resistance values (R1 and R4) easily influences the resistance variation in the entire electric resistance value R.

Figure 5:
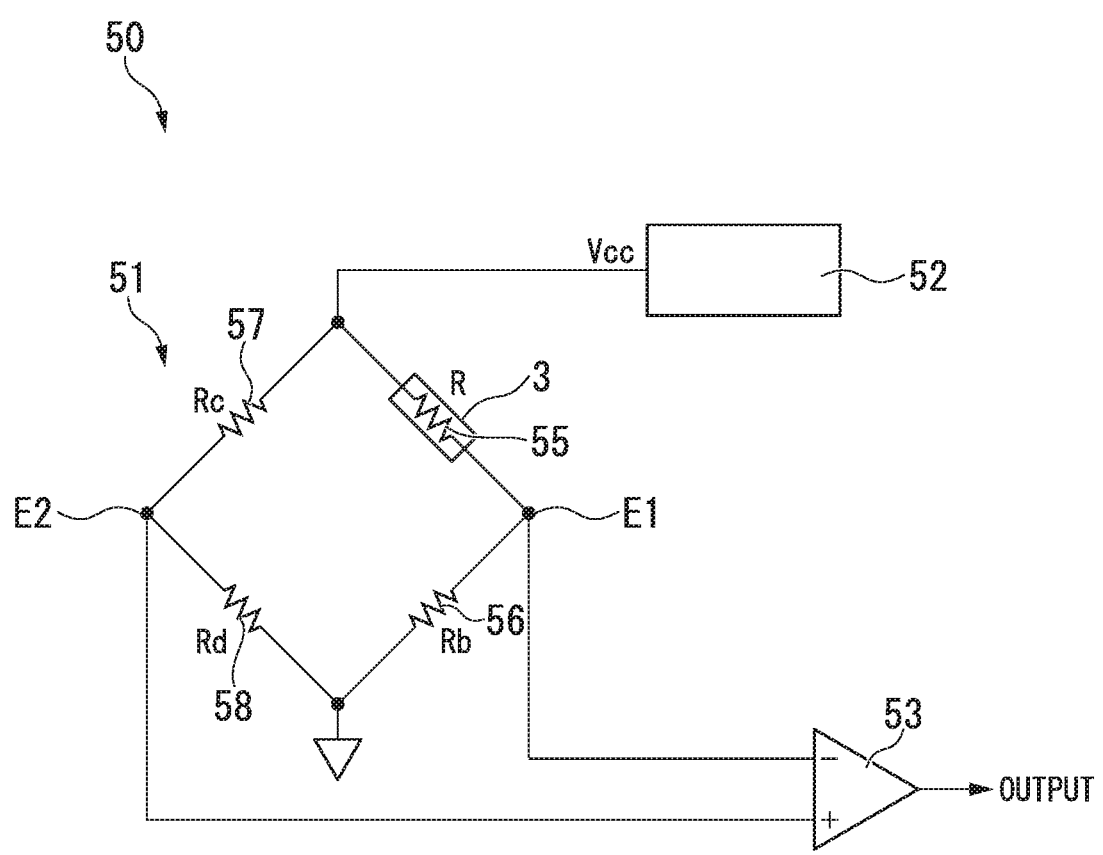
FIG. 5 is a configuration diagram of a detection circuit shown in FIG. 1.

As shown in FIG. 5, the detection circuit 50 includes a bridge circuit (Wheatstone bridge circuit) 51, a reference voltage generation circuit 52, and an operation amplification circuit 53.

In the bridge circuit 51, a branch side in which the entire sensor resistance 55 of the cantilever 3 and the first fixed resistance 56 are connected to each other in series and a branch side in which a second fixed resistance 57 and a third fixed resistance 58 are connected to each other in series are connected to the reference voltage generation circuit 52 in parallel.

Moreover, the electric resistance value of the sensor resistance 55 is the above-described electric resistance value R. The electric resistance values of the fixed resistances 56, 57, and 58 are electric resistance values Rb, Rc, and Rd, respectively.

In the bridge circuit 51, a connection point (middle-point voltage E1) between the sensor resistance 55 and the first fixed resistance 56 is connected to an inverted input terminal (− terminal) of the operation amplification circuit 53, and a connection point (middle-point voltage E2) between the second fixed resistance 57 and the third fixed resistance 58 is connected to a non-inverted input terminal (+ terminal) of the operation amplification circuit 53.

The reference voltage generation circuit 52 applies a predetermined reference voltage Vcc to the bridge circuit 51. The operation amplification circuit 53 detects a potential difference between the middle-point voltage E1 and the middle-point voltage E2, amplifies the potential difference by a predetermined amplification ratio, and outputs the amplified potential difference. The potential difference becomes a value according to the resistance variation in the electric resistance values R, that is, a value based on the displacement of the cantilever 3.

(Operation of Pressure Sensor)

Next, a case where the variation in pressures is detected using the above-described pressure sensor 1 will be described.

Figure 6:
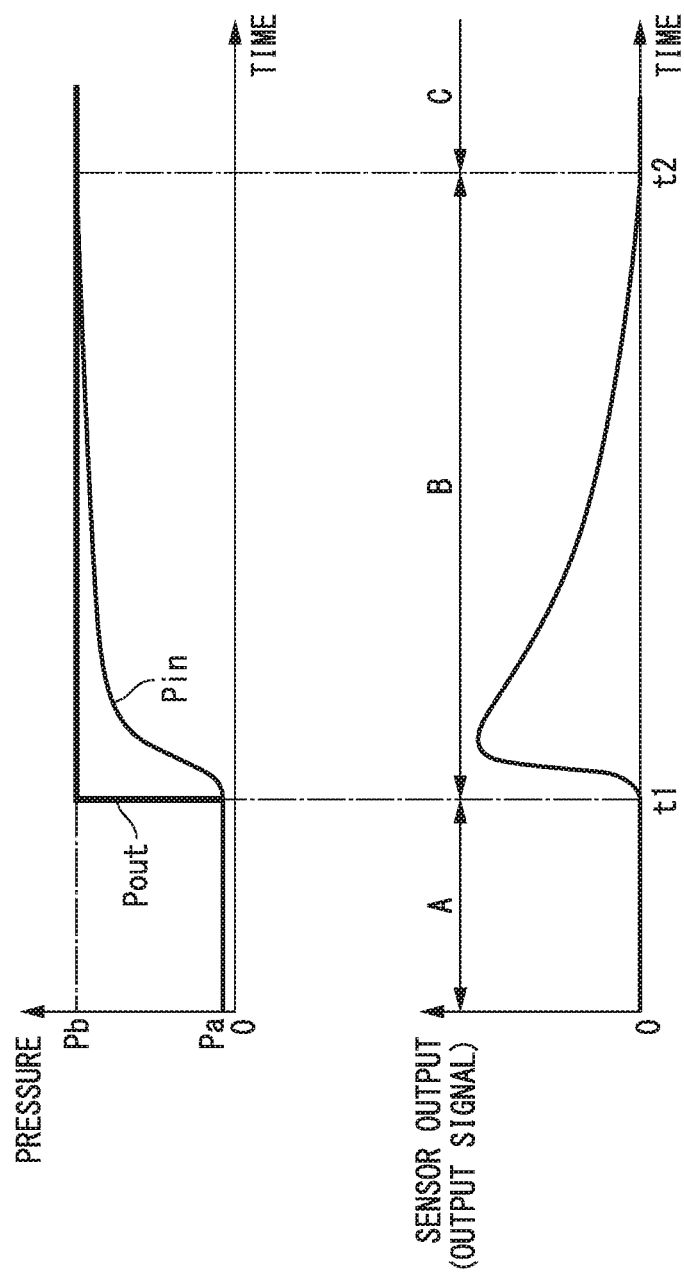
FIG. 6 is a diagram showing an example of an output signal of the pressure sensor shown in FIG. 1, and is a diagram showing a relationship between an external atmospheric pressure and an internal atmospheric pressure and a sensor output corresponding to the relationship.
Figure 7A:
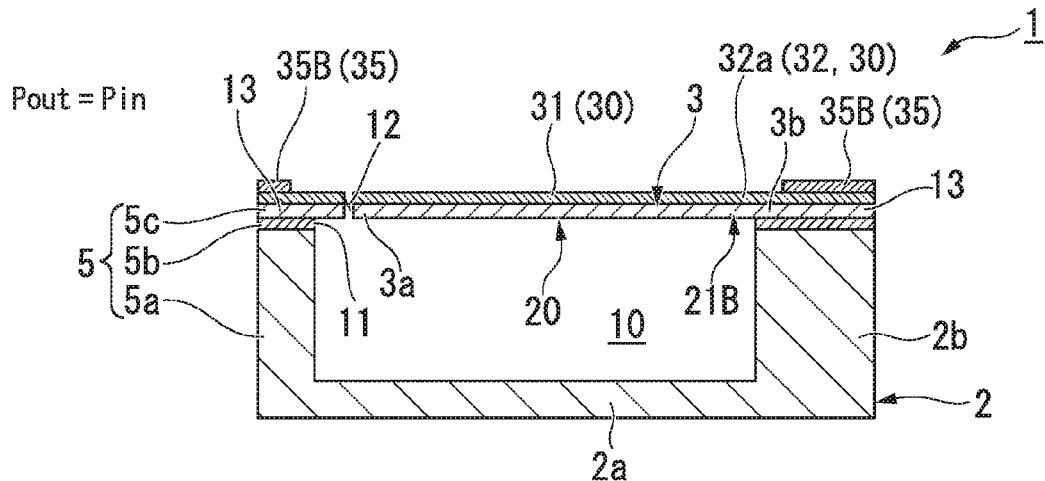
FIG. 7A is a view showing an example of an operation of the pressure sensor shown in FIG. 1, and is a view showing a state of the pressure sensor with the external atmospheric pressure being the same as the internal atmospheric pressure.

First, like a period A before a time t1 shown in FIG. 6, in a case where a pressure difference between a pressure (hereinafter, referred to as an external atmospheric pressure Pout) outside the cavity 10 and a pressure (hereinafter, referred to as an internal atmospheric pressure Pin) inside the cavity 10 is zero, the cantilever 3 is not bent as shown in FIG. 7A. Accordingly, an output signal (sensor output) output from the detection circuit 50 is a predetermined value (for example, zero).

Figure 7B:
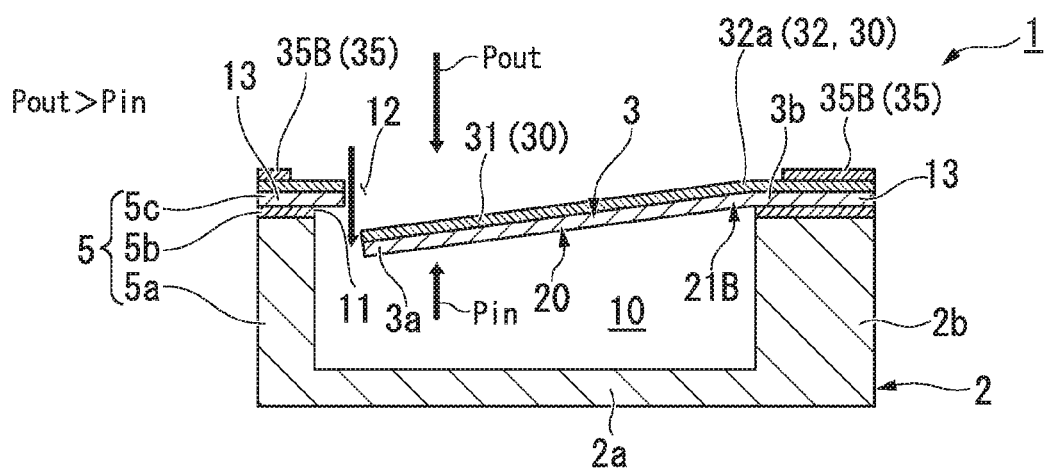
FIG. 7B is a view showing an example of the operation of the pressure sensor shown in FIG. 1, and is a view showing the state of the pressure sensor when the external atmospheric pressure is higher than the internal atmospheric pressure.

In addition, like a period B after the time t1 shown in FIG. 6, for example, if the external atmospheric pressure Pout increases stepwise, since the pressure difference is generated between the inside and the outside of the cavity 10, the cantilever 3 is bent toward the inside of the cavity 10 as shown in FIG. 7B.

Accordingly, since distortion is generated in the main body-resistance portion 31 formed in the lever main body 20 and the lever-resistance portion 32 formed in the lever support portions 21A and 21B according to the bending of the cantilever 3, and since the entire electric resistance value R is changed according to the distortion, the output signal increases as shown in FIG. 6.

In addition, since the pressure transmission medium flows from the outside of the cavity 10 toward the inside thereof via the gap 12 after the increase in the external atmospheric pressure Pout, as shown in FIG. 6, the internal atmospheric pressure Pin increases at a response which is more gentle relative to the variation in the external atmospheric pressures Pout while being slower than the external atmospheric pressure Pout with the lapse of time.

Accordingly, since the internal atmospheric pressure Pin gradually approaches the external atmospheric pressure Pout, the pressure inside the cavity 10 and the pressure outside the cavity 10 are equilibrated, the bending of the cantilever 3 gradually decreases, and, as shown in FIG. 6, the output signal gradually decreases.

Figure 7C:
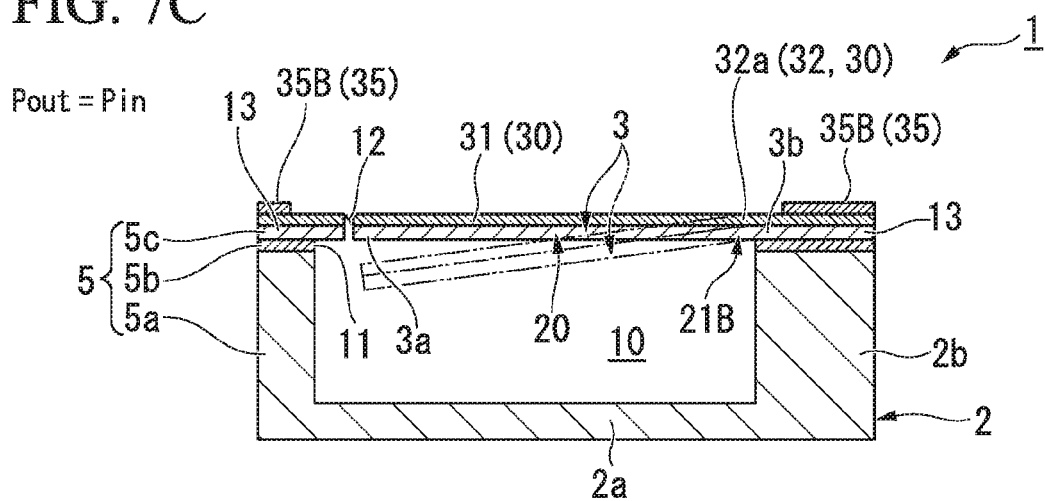
FIG. 7C is a view showing an example of the operation of the pressure sensor shown in FIG. 1, and is a view showing the state of the pressure sensor when the external atmospheric pressure and the internal atmospheric pressure equilibrate with each other.

In addition, if the internal atmospheric pressure Pin and the external atmospheric pressure Pout are the same as each other, as shown in of FIG. 7C, the bending of the cantilever 3 is released such that the shape of the cantilever 3 is returned to the original shape, and like the period C after the time t2 shown in FIG. 6, the output signal becomes a predetermined value (for example, zero) again.

In this way, it is possible to detect the variation in pressures by monitoring the variation in the output signals based on the displacement of the cantilever 3 by displacement detection unit 4.

Particularly, since the cantilever 3 can be formed by a semiconductor process technology using the silicon active layer 5c of the SOI substrate 5, the thickness can be easily decreased (for example, several ten nanometers to several hundred nanometers) compared to the piezoelectric element of the related art. Accordingly, it is possible to accurately detect minute variation in pressures.

Moreover, as shown in FIG. 4, in the pressure sensor 1 of the present embodiment, the first resistance portions 32a of the two lever support portions 21A and 21B are connected to each other by two parallel paths of the first path S1 and the second path S2.

Accordingly, the displacement detection unit 4 detects the displacement of the cantilever 3 based on the resistance variation in the resistance values (resistance variation in the resistance values of R1, R4, and R5 in Expression 1) of the first path S1, and the resistance variation in the resistance values (resistance variation in the resistance values of R1, R2, R3, R4, and R6 in Expression 1) of the second path S2.

The cantilever 3 is bent the two lever support portions 21A and 21B as a center, the two lever support portions 21A and 21B are more positively displaced than the lever main body 20. Accordingly, the stress detection portion which greatly contributes to sensitivity becomes the first resistance portion 32a and the second resistance portion 32b in the lever support portions 21A and 21B. In contrast, the main body-resistance portion 31 in the lever main body 20 becomes a stress detection portion which has a small contribution degree (contribution margin) with respect to sensitivity.

In addition, since it is more difficult to bend the base end portion 3b of the cantilever 3, the base end-resistance portion 33 becomes a stress detection portion which has a smaller contribution degree (contribution margin) with respect to the sensitivity.

Accordingly, since the first resistance portions 32a of the two lever support portions 21A and 21B are electrically connected to each other by the two parallel paths of the first path S1 and the second path S2, it is possible to decrease influences of the main body-resistance portion 31 having a small contribution margin with respect to sensitivity if possible, and it is possible to positively use the second resistance portion 32b which greatly contributes to the sensitivity.

That is, it is possible to increase sensitivity between both detection electrodes 35A and 35B by increasing the resistance ratio of the first resistance portion 32a (electric resistance values R1 and R4) with respect to the entire resistance (electric resistance value R) between the first detection electrode 35A and the second detection electrode 35B. Alternatively, it is possible to increase sensitivity of the parallel path portion which electrically connects the first resistance portions 32a by increasing the influences of the second resistance portion 32b (electric resistance values R2 and R3), and as a result, it is possible to increase sensitivity between the both detection electrodes 35A and 35B.

Accordingly, it is possible to increase the sensitivity, that is, a resistance variation ratio $\Delta R/R$ ($\Delta R$ is a resistance changed portion), and it is possible to sensitively detect the displacement of the cantilever 3. Accordingly, it is possible to provide a pressure sensor 1 having high performance capable of improving the sensitivity of the sensor and accurately detecting the variation in pressures.

As a result, for example, it is possible to sensitively detect the variation in pressures of a low frequency band of 1 Hz or less, and it is possible to decrease the lower limit frequency which can be detected.

In addition, since the first resistance portions 32a of the two lever support portions 21A and 21B are electrically connected to each other by the two parallel paths of the first path S1 and the second path S2, it is possible to select a plurality of methods with respect to improvement of sensitivity according to contrivances of both paths S1 and S2.

For example, since it is possible to increase the influences of the first resistance portion 32a which is connected to the first detection electrode 35A and the second detection electrode 35B in series by the contrivance of the second path S2 side if possible, it is possible to increase a ratio of the resistance of the first resistance portion 32a with respect to the entire resistance (electric resistance value R) between both detection electrodes 35A and 35B, and it is possible to increase the sensitivity.

In addition, since the electric resistance value (R5) of the main body-resistance portion 31 is increased by the contrivance of the first path S1 side, the sensitivity of the parallel path portion which electrically connects the first resistance portions 32a to each other is increased by increasing the influences of the second resistance portion 32b which greatly contributes to the sensitivity. Accordingly, it is possible to increase the entire sensitivity between both detection electrodes 35A and 35B.

In this way, since it is possible to select a plurality of methods with respect to the sensitivity improvement, it is possible to increase a degree of freedom in design, and the pressure sensor 1 can be easily used for various purposes.

As described above, according to the pressure sensor 1 of the present embodiment, it is possible to provide the sensor having high performance capable of accurately detecting the variation in pressures, decreasing the lower limit frequency which can be detected, and sensitively detecting the variation in pressures of the low frequency band.

In addition, since the pressure sensor 1 of the present embodiment can obtain the above-described effects, the pressure sensor 1 can be applied to the following various uses.

For example, the pressure sensor 1 can be applied to a car navigation device. For example, in this case, since a difference in atmospheric pressures can be detected based on a height difference using the pressure sensor 1, an elevated road and a road under an elevated road are correctly determined, and the determination can be reflected in the navigation result.

In addition, the pressure sensor 1 can be applied to a portable navigation device. For example, in this case, since a difference in atmospheric pressures can be detected based on a height difference using the pressure sensor 1, a floor number in a building in which a user is positioned is correctly determined, and the determination can be reflected in a navigation result.

In addition, since the pressure sensor 1 can detect variation in atmospheric pressures in a room, for example, the pressure sensor 1 can be applied to a security device in a building or an automobile. Particularly, since the pressure sensor 1 can sensitively detect the variation in pressures of the frequency band of 1 Hz or less, the pressure sensor 1 can detect the variation in pressures based on opening and closing of a door or a sliding door, or the like, and the pressure sensor 1 can be appropriately applied to a security device or the like.

Second Embodiment

Next, a second embodiment according to the present invention will be described with reference to the drawings.

In addition, in the second embodiment, the same reference numerals are assigned to the same components and portions as those of the first embodiment, and descriptions thereof are omitted.

Figure 8:
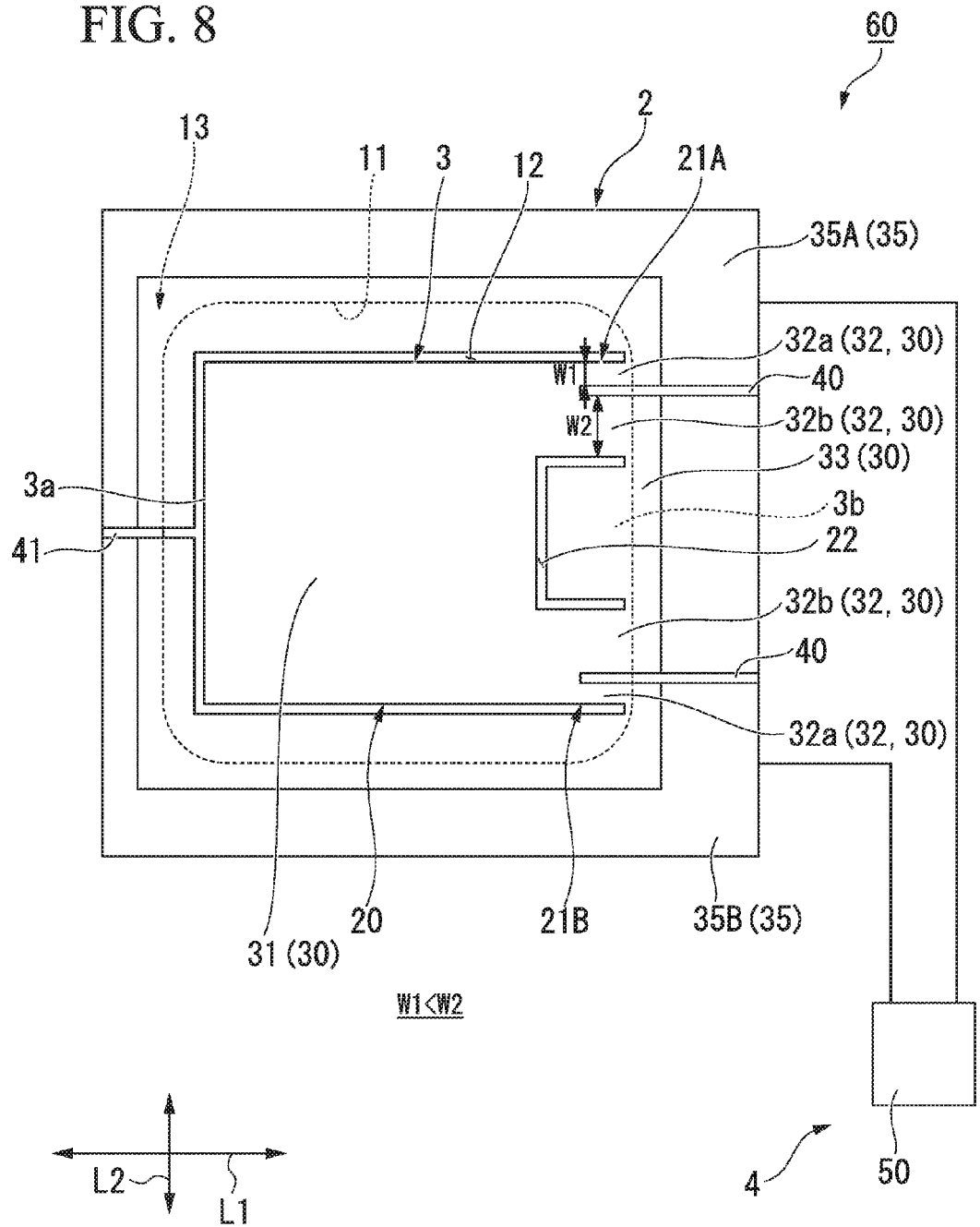
FIG. 8 is a view showing a second embodiment of the present invention and is a plan view of a pressure sensor.

As shown in FIG. 8, in a pressure sensor 60 of the present embodiment, the first resistance portion 32a and the second resistance portion 32b are divided by the division groove 40 such that the first width W1 of the first resistance portion 32a is narrower than the second width W2 of the second resistance portion 32b.

According to the pressure sensor 60 having the above-described configuration, since the electric resistance value (R1, R4) of the first resistance portion 32a can be larger than the electric resistance value (R2, R3) of the second resistance portion 32b, it is possible to further increase the resistance ratio of the first resistance portion 32a which is connected to the first detection electrode 35A and the second detection electrode 35B in series with respect to the entire resistance (electric resistance value R) between the first detection electrode 35A and the second detection electrode 35B.

Accordingly, it is possible to further improve the sensitivity of the sensor and it is possible to reduce power consumption.

Third Embodiment

Next, a third embodiment according to the present invention will be described with reference to the drawings. In addition, in the third embodiment, the same reference numerals are assigned to the same components and portions as those of the first embodiment, and descriptions thereof are omitted.

Figure 9:
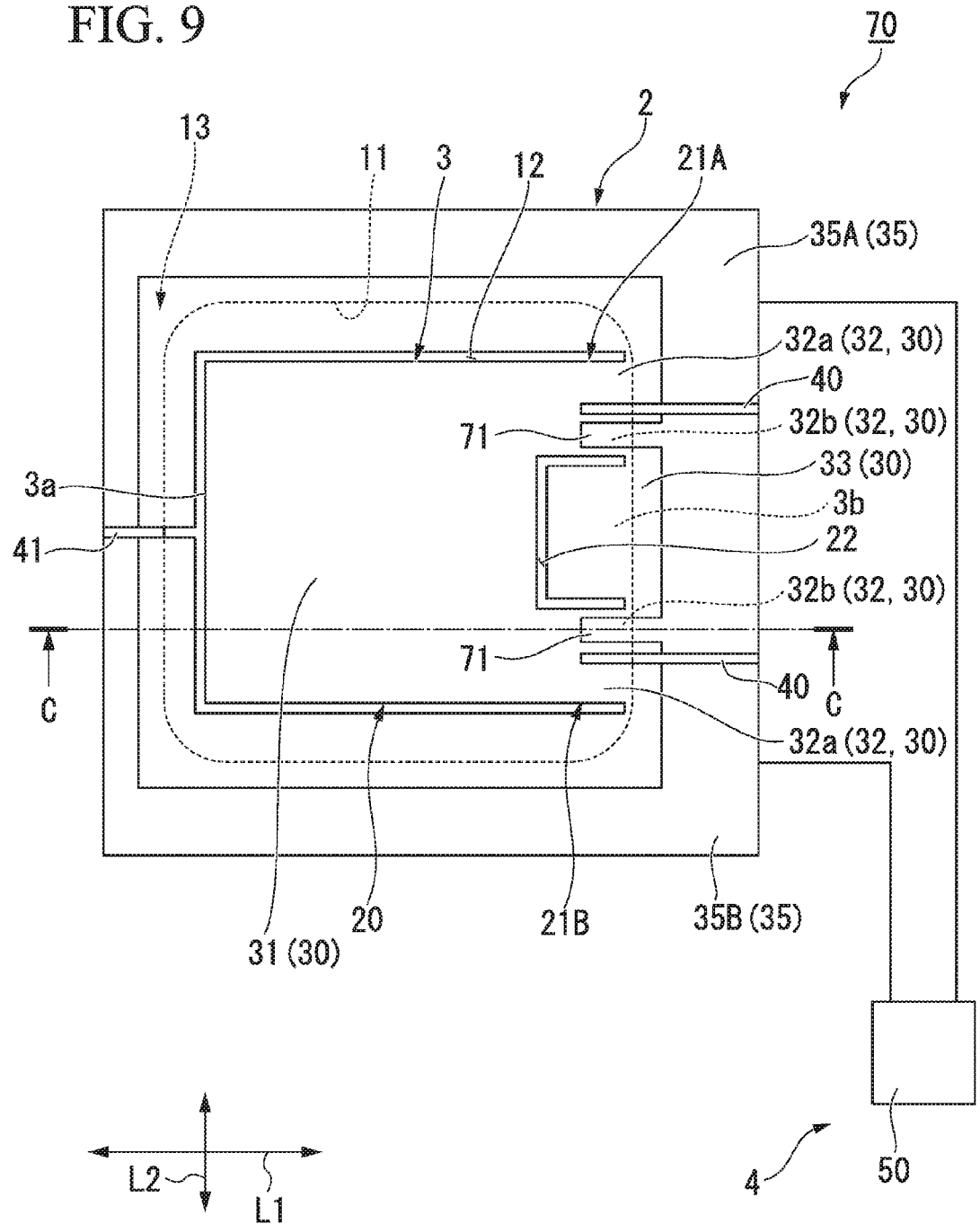
FIG. 9 is a view showing a third embodiment of the present invention and is a plan view of a pressure sensor.
Figure 10:
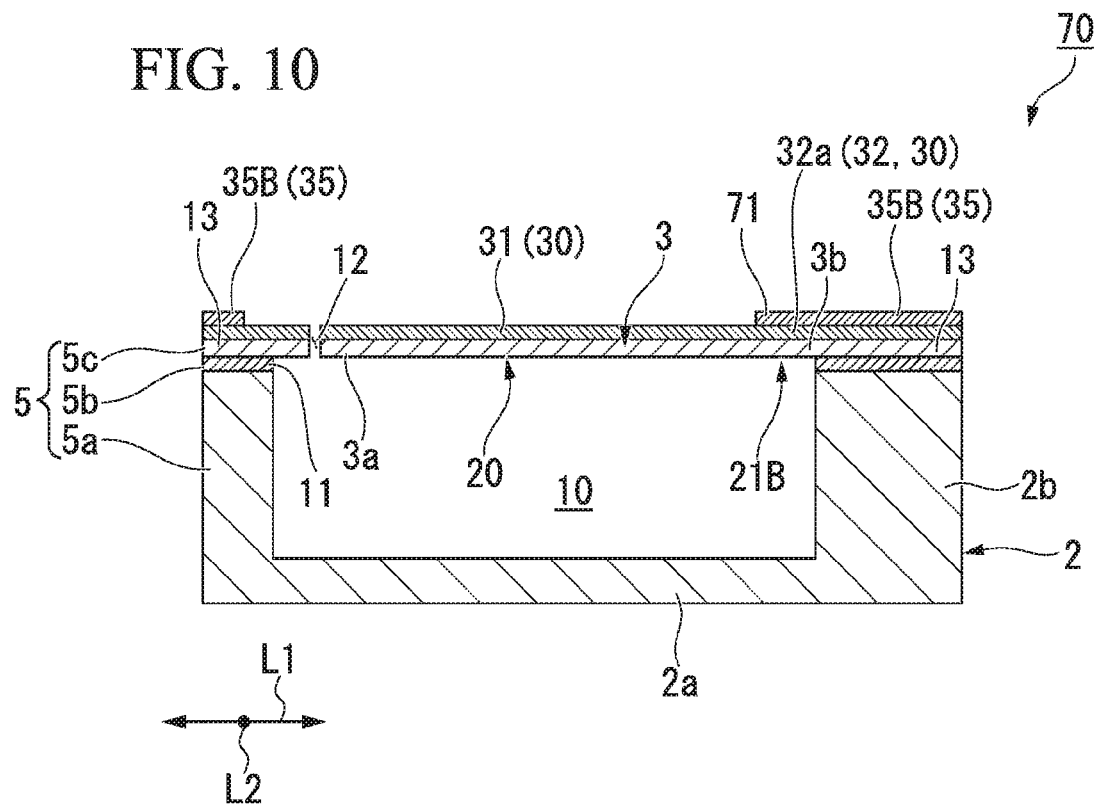
FIG. 10 is a sectional view of the pressure sensor taken along a line C-C shown in FIG. 9.

As shown in FIGS. 9 and 10, in a pressure sensor 70 of the present embodiment, a conductor 71 having electric resistivity which is smaller than that of the first resistance portion 32a is formed on the second resistance portion 32b. In the shown example, the conductor 71 has a conductor pattern which extends from the detection electrode 35 having electric resistivity which is smaller than that of the piezoresistance 30 to the second resistance portion 32b.

However, the present invention is not limited to this case, and the conductor 71 may be formed of a material different from that of the detection electrode 35.

According to the pressure sensor 70 having the above-described configuration, since the electric resistance value (R2, R3) of the second resistance portion 32b can be smaller than the electric resistance value (R1, R4) of the first resistance portion 32a, it is possible to increase the electric resistance value (R1, R4) of the first resistance portion 32a relative to that of the second resistance portion 32b.

Accordingly, it is possible to further increase the resistance ratio of the first resistance portion 32a which is connected to the first detection electrode 35A and the second detection electrode 35B in series with respect to the entire resistance (electric resistance value R) between the first detection electrode 35A and the second detection electrode 35B. Therefore, it is possible to further improve the sensitivity of the sensor.

Fourth Embodiment

Next, a fourth embodiment according to the present invention will be described with reference to the drawings. In addition, in the fourth embodiment, the same reference numerals are assigned to the same components and portions as those of the first embodiment, and descriptions thereof are omitted.

Figure 11:
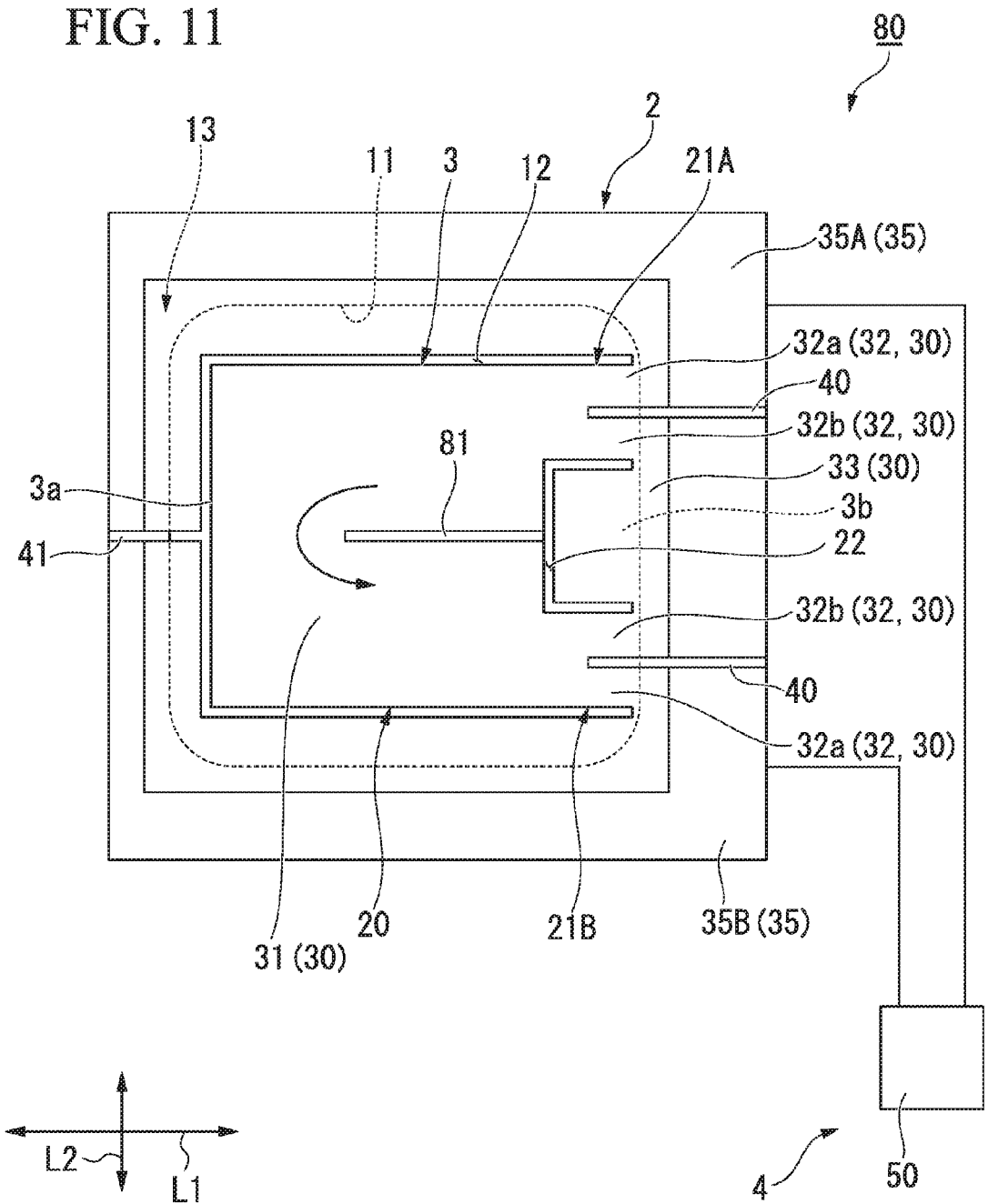
FIG. 11 is a view showing a fourth embodiment of the present invention and is a plan view of a pressure sensor.

As shown in FIG. 11, in a pressure sensor 80 of the present embodiment, a groove portion (resistance-increase portion) 81 which increases the resistance of the main body-resistance portion 31 is formed on the main body-resistance portion 31 which is formed in the lever main body 20.

The groove portion 81 is disposed at the center portion of the lever main body 20 in the lateral direction L2, and linearly extends in the vertical direction L1. In this case, one end portion of the groove portion 81 is connected to the auxiliary gap 22 and the other end of the groove portion 81 is separated from the gap 12.

Accordingly, as shown by an arrow in FIG. 11, since a current which flows through the main body-resistance portion 31 flows so as to bypass the groove portion 81, the distance is lengthened according to the bypassing. Therefore, it is possible to further increase the electric resistance value (R5) of the main body-resistance portion 31.

In addition, for example, the groove portion 81 is formed by a depth which approximately reaches the oxide layer 5b. However, the present invention is not limited to this case, and the groove portion 81 may be formed so as to penetrate the lever main body 20.

According to the pressure sensor 80 having the above-described configuration, since it is possible to further increase the electric resistance value (R5) of the main body-resistance portion 31, it is possible to preferentially use the second path S2 than the first path S1, and it is possible to increase the influences of the second resistance portion 32b which greatly contributes to sensitivity.

Accordingly, for example, it is possible to increase the sensitivity of the parallel path portion which electrically connects the first resistance portions 32a to each other, and it is possible to increase the sensitivity between the first detection electrode 35A and the second detection electrode 35B. As a result, it is possible to further improve the sensitivity of the sensor, and it is possible to reduce power consumption.

Figure 12:
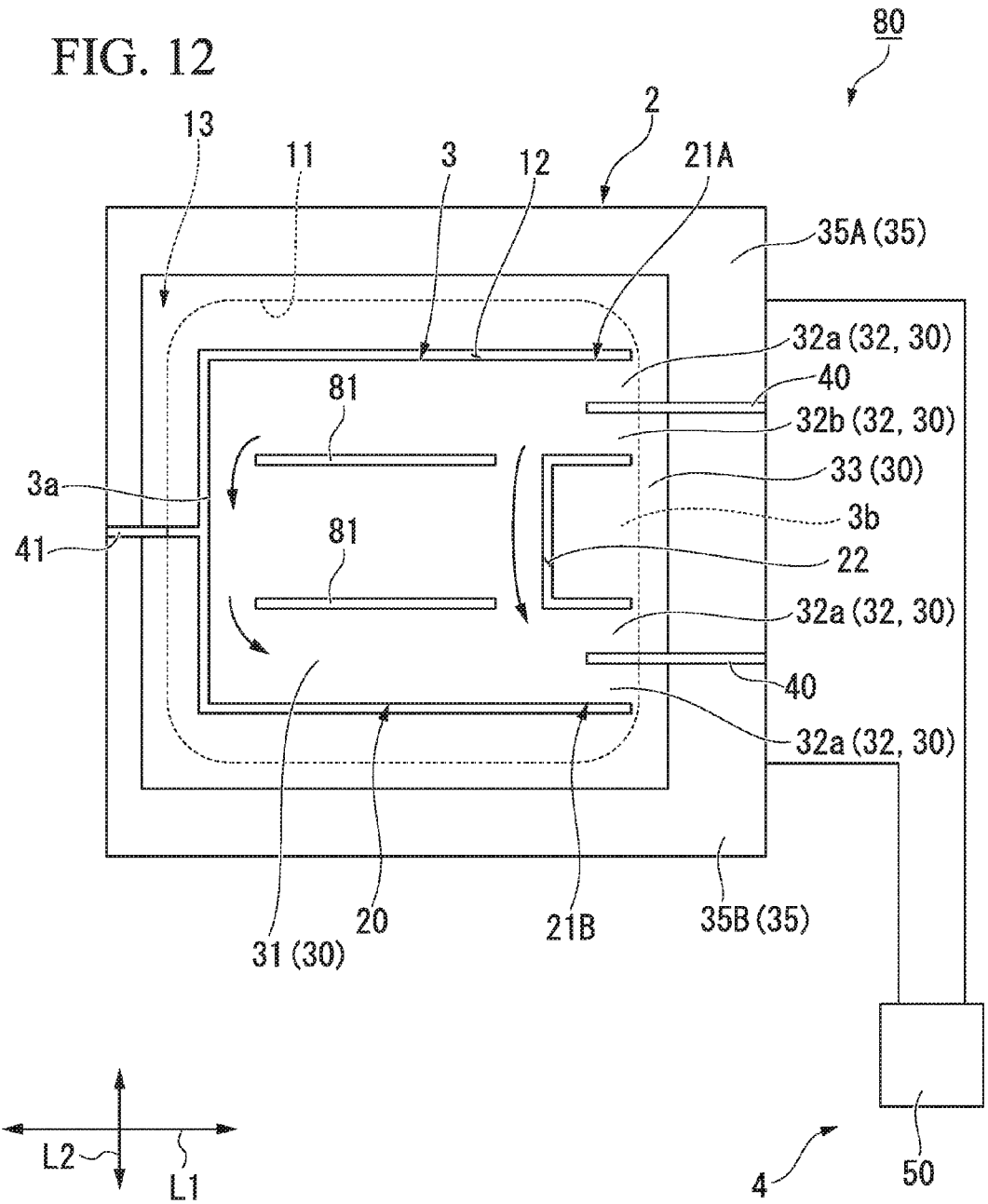
FIG. 12 is a plan view of a pressure sensor showing a modification example of the fourth embodiment of the present invention.

In addition, the number and the formation positions of the groove portions 81 are not limited to the above-described case. For example, as shown in FIG. 12, two groove portions 81 may be disposed so as to be parallel with each other at an interval in the lateral direction L2.

In the shown example, both end portions of the two groove portions 81 are disposed so as to be separated from the auxiliary gap 22 and the gap 12. In this case, since the two groove portions 81 interrupt the flow (arrows shown in FIG. 12) of the current which flows through the main body-resistance portion 31, it is possible to further increase the electric resistance value (R5) of the main body-resistance portion 31. Accordingly, similar effects can be obtained.

In addition, as the method which increases the resistance of the main body-resistance portion 31, the present invention is not limited to the machining which is performed on the groove portion 81.

Figure 13:
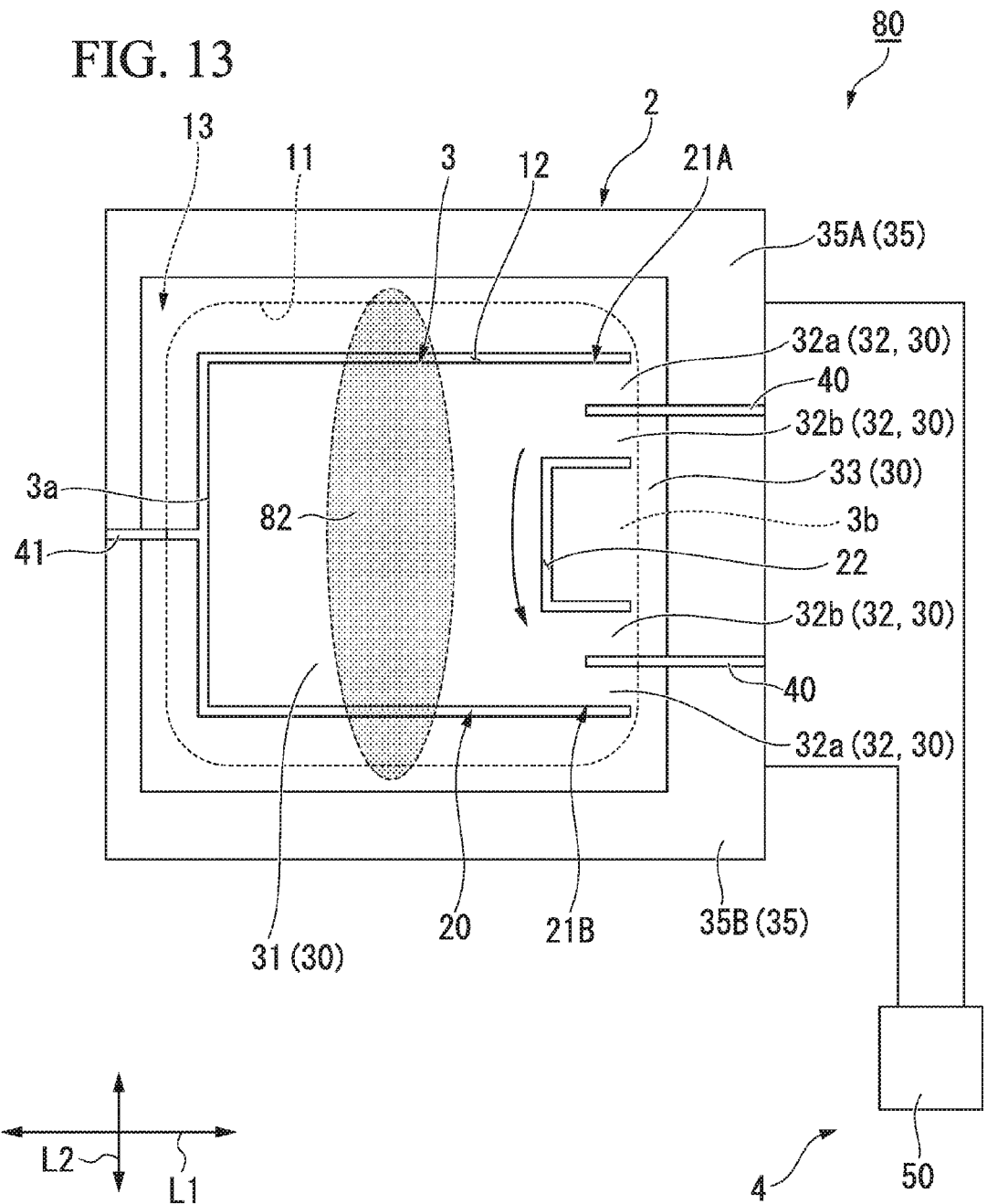
FIG. 13 is a plan view of a pressure sensor showing another modification example of the fourth embodiment of the present invention.

For example, as shown in FIG. 13, an undoped portion (resistance-increase portion) 82 serving as an insulation layer (electrically insulating layer) may be provided on the main body-resistance portion 31. In addition, for easy understanding in the drawing, the undoped portion 82 is hatched.

In the shown example, the undoped portion 82 is formed in an elliptical shape in plan view having a long axis in the lateral direction L2, and the length of the undoped portion 82 in the lateral direction L2 is longer than the width of the cantilever 3. In addition, the undoped portion 82 is disposed at the center portion of the lever main body 20 in the vertical direction L1.

Accordingly, as shown by an arrow in FIG. 13, a current which flows through the main body-resistance portion 31 flows so as to pass through a narrow portion between the auxiliary gap 22 and the undoped portion 82.

Accordingly, in this case, since the flow of the current which flows through the main body-resistance portion 31 can be interrupted by the undoped portion 82, it is possible to further increase the electric resistance value (R5) of the main body-resistance portion 31, and similar effects can be obtained.

Particularly, in this case, it is not necessary to perform the machining such as the groove portion 81, and for example, since the undoped portion 82 can be formed by a simple operation such as selecting and classifying a region which is doped and a region which is not doped when the piezoresistance 30 is formed, it is possible to effectively manufacture the pressure sensor 80. In addition, since the machining is not required, it is possible to prevent rigidity of the cantilever 3 from being decreased, and it is possible to easily obtain the pressure sensor 80 having high quality.

Figure 14:
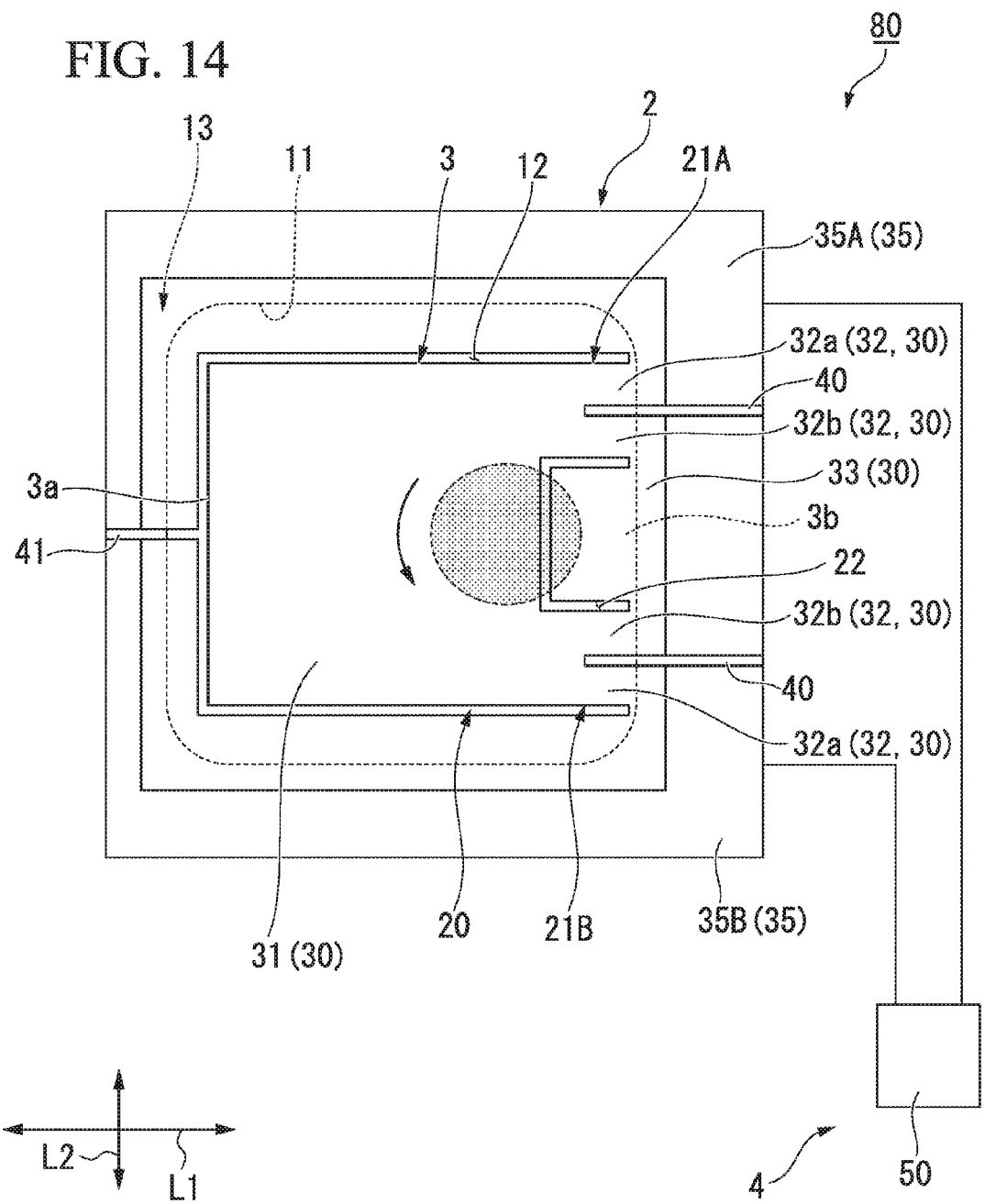
FIG. 14 is a plan view of a pressure sensor showing still another modification example of the fourth embodiment of the present invention.

In addition, the shape of the undoped portion 82 is not limited to the above-described case, and for example, as shown in FIG. 14, the undoped portion 82 may be formed to come into contact with the auxiliary gap 22.

In this case, as shown by an arrow in FIG. 14, since a current which flows through the main body-resistance portion 31 flows so as to bypass the undoped portion 82, the distance is lengthened according to the bypassing. Accordingly, similarly, it is possible to further increase the electric resistance value (R5) of the main body-resistance portion 31.

Fifth Embodiment

Next, a fifth embodiment of the present invention will be described with reference to the drawings. In addition, in the fifth embodiment, the same reference numerals are assigned to the same components and portions as those of the first embodiment, and descriptions thereof are omitted.

Figure 15:
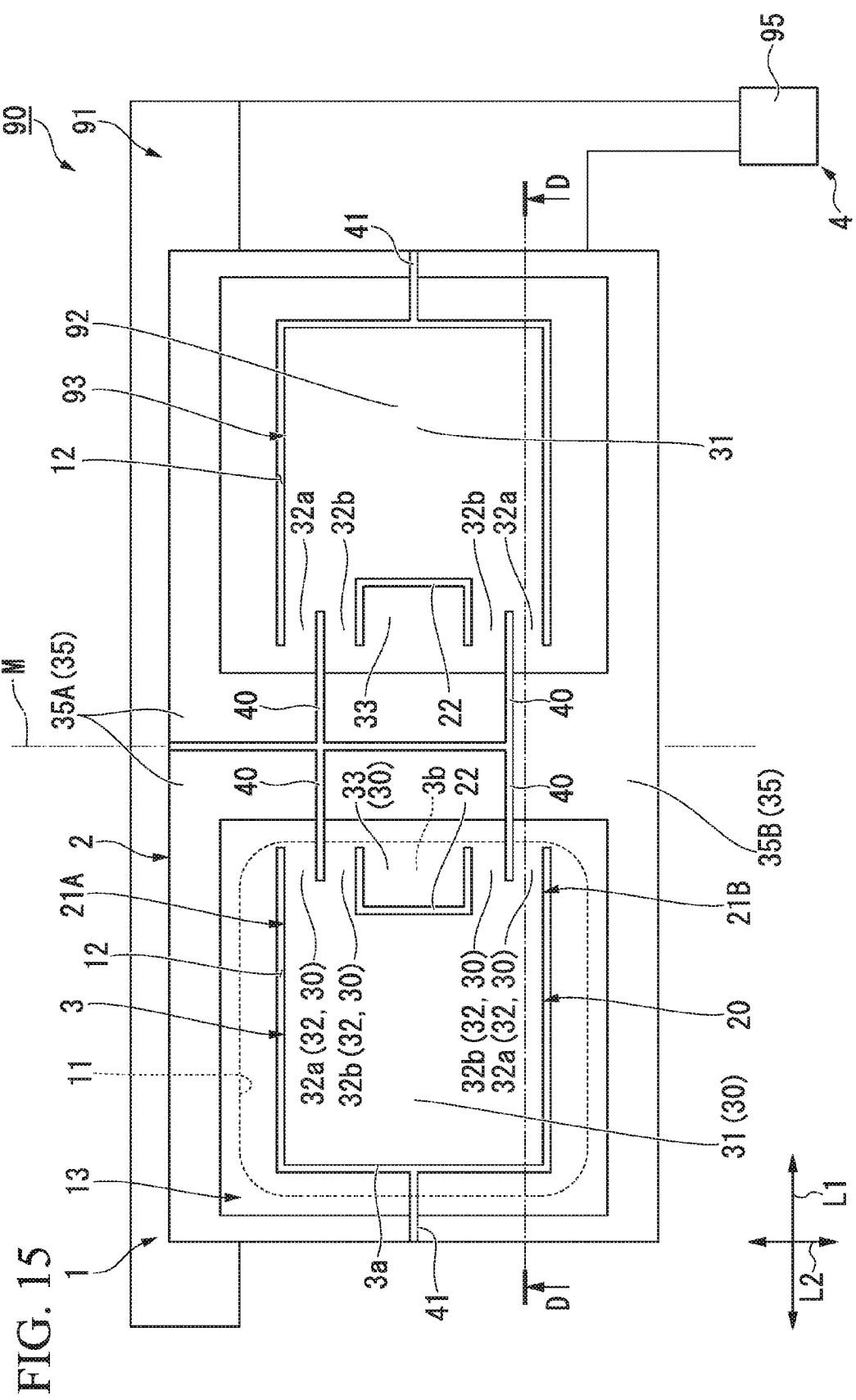
FIG. 15 is a view showing a fifth embodiment of the present invention and is a plan view of a pressure sensor.
Figure 16:
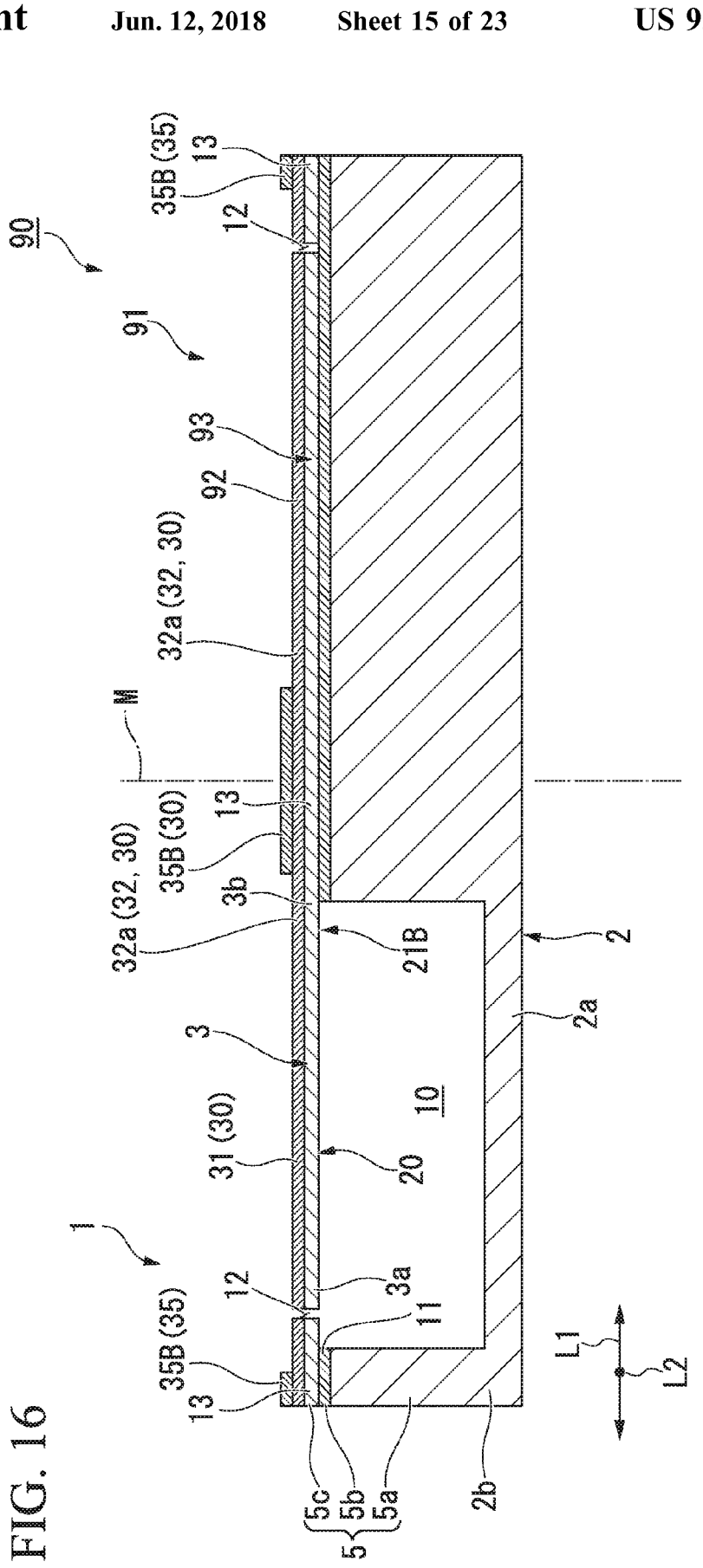
FIG. 16 is a sectional view of the pressure sensor taken along a line D-D shown in FIG. 15.

As shown in FIGS. 15 and 16, a pressure sensor 90 of the present embodiment further includes a reference sensor 91 in addition to the pressure sensor 1 according to the first embodiment.

For example, the reference sensor 91 is integrally formed with the pressure sensor 1 using the SOI substrate 5 used together with the pressure sensor 1. In addition, the reference sensor 91 is formed so as to have the approximately same outline shape as that of the pressure sensor 1, and is formed to be connected to the pressure sensor 1 in the vertical direction L1. In addition, in the shown example, the pressure sensor 1 and the reference sensor 91 are formed to be symmetrically disposed with respect to a virtual plane M in the lateral direction L2.

However, the present invention is not limited to this case, and the disposition relationship between the pressure sensor 1 and the reference sensor 91 may be freely modified.

The reference sensor 91 does not include the cavity 10 while the pressure sensor 1 includes the cavity 10. The reference sensor 91 is different from the pressure sensor 1 in that the reference sensor 91 does not include the cavity 10. However, the reference sensor 91 similarly includes the constituent members of the pressure sensor 1 except for the cavity 10.

That is, in the reference sensor 91, the gap 12, the auxiliary gap 22, and the detection electrode 35 are similarly formed in the silicon active layer 5c and the oxide layer 5b, and a reference piezoresistance (reference-resistance portion) 92 which is the same as the piezoresistance 30 of the pressure sensor 1 is formed.

Accordingly, the reference sensor 91 includes a reference portion 93 in which the piezoresistance 92 is formed.

The reference portion 93 has an outline shape similar to that of the cantilever 3 of the pressure sensor 1 in plan view by the gap 12 and the auxiliary gap 22. However, since the reference sensor 91 does not include the cavity 10, the reference portion 93 is not a lever and has a structure in which the silicon support layer 5a, the oxide layer 5b, and the silicon active layer 5c are integrated with each other. In addition, in the reference portion 93, since the upper surface is exposed to the outside, for example, the reference portion 93 is influenced by a surrounding environment such as a temperature.

In addition, similarly to the cantilever 3, the division groove 40 is formed in the reference portion 93. Accordingly, similarly to the pressure sensor 1, the reference portion 93 includes respective resistance portions (first resistance portion 32a, second resistance portion 32b, base end-resistance portion 33, and main body-resistance portion 31) included in the pressure sensor 1.

According to the pressure sensor 90 of the present embodiment having the above-described configuration, it is possible to cancel out influences of the surrounding environment such as a temperature by taking a difference between the sensor output of the pressure sensor 1 and the sensor output of the reference sensor 91, and it is possible to obtain only the output generated due to variation in the external atmospheric pressures Pout (external pressures).

Figure 17:
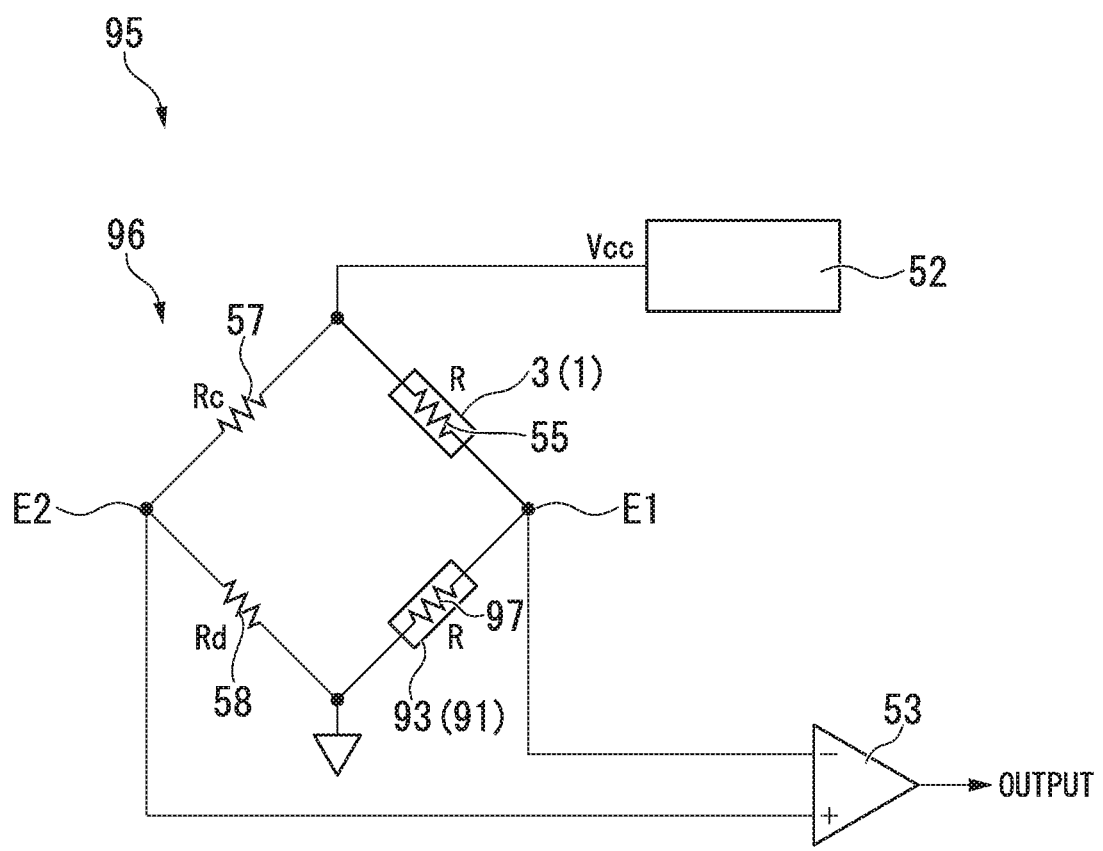
FIG. 17 is a configuration diagram of a detection circuit shown in FIG. 15.

Specifically, the displacement detection unit 4 of the present embodiment includes a detection circuit 95 including a bridge circuit 96 shown in FIG. 17.

In the bridge circuit 96, a branch side in which the entire sensor resistance 55 of the pressure sensor 1 and the entire sensor resistance 97 of the reference sensor 91 are connected to each other in series and a branch side in which the second fixed resistance 57 and the third fixed resistance 58 are connected to each other in series are connected to the reference voltage generation circuit 52 in parallel.

In addition, similarly to the cantilever 3, the electric resistance value of the sensor resistance 97 is the electric resistance value R.

Since the bridge circuit 96 has the circuit portion which connects the pressure sensor 1 and the reference sensor 91 in series as described above, the middle-point voltage E1 in the circuit becomes the voltage corresponding to the difference between the resistance value of the sensor resistance 55 in the pressure sensor 1 and the resistance value of the sensor resistance 97 in the reference sensor 91.

The operation amplification circuit 53 outputs the potential difference between the middle-point voltage E1 and the middle-point voltage E2. However, since the voltage of the middle-point voltage E2 is determined by the fixed resistance, the voltage is a constant voltage.

Accordingly, since the difference of the middle-point voltage E1 becomes the potential difference between the middle-point voltage E1 and the middle-point voltage E2, it is possible to accurately detect the variation in the external atmospheric pressures Pout in which the surrounding environment such as a temperature is cancelled out, based on the output from the operation amplification circuit 53. Therefore, it is possible to more accurately detect the variation in pressures of a desired frequency band.

Sixth Embodiment

Next, a sixth embodiment according to the present invention will be described with reference to the drawings. In addition, in the sixth embodiment, the same reference numerals are assigned to the same components and portions as those of the first embodiment, and descriptions thereof are omitted.

Figure 18:
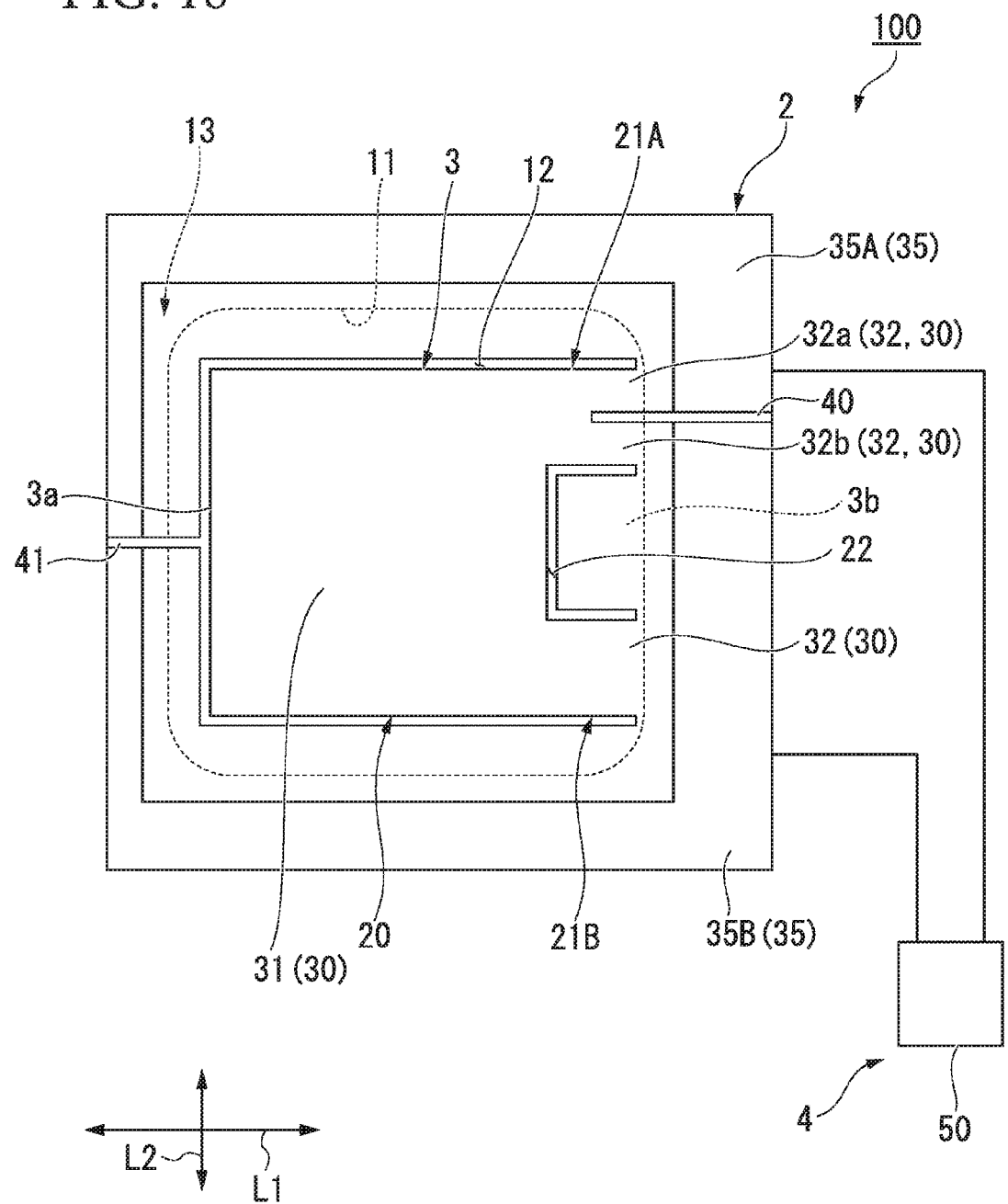
FIG. 18 is a view showing a sixth embodiment according to the present invention, and is a plan view of a pressure sensor.
Figure 19:
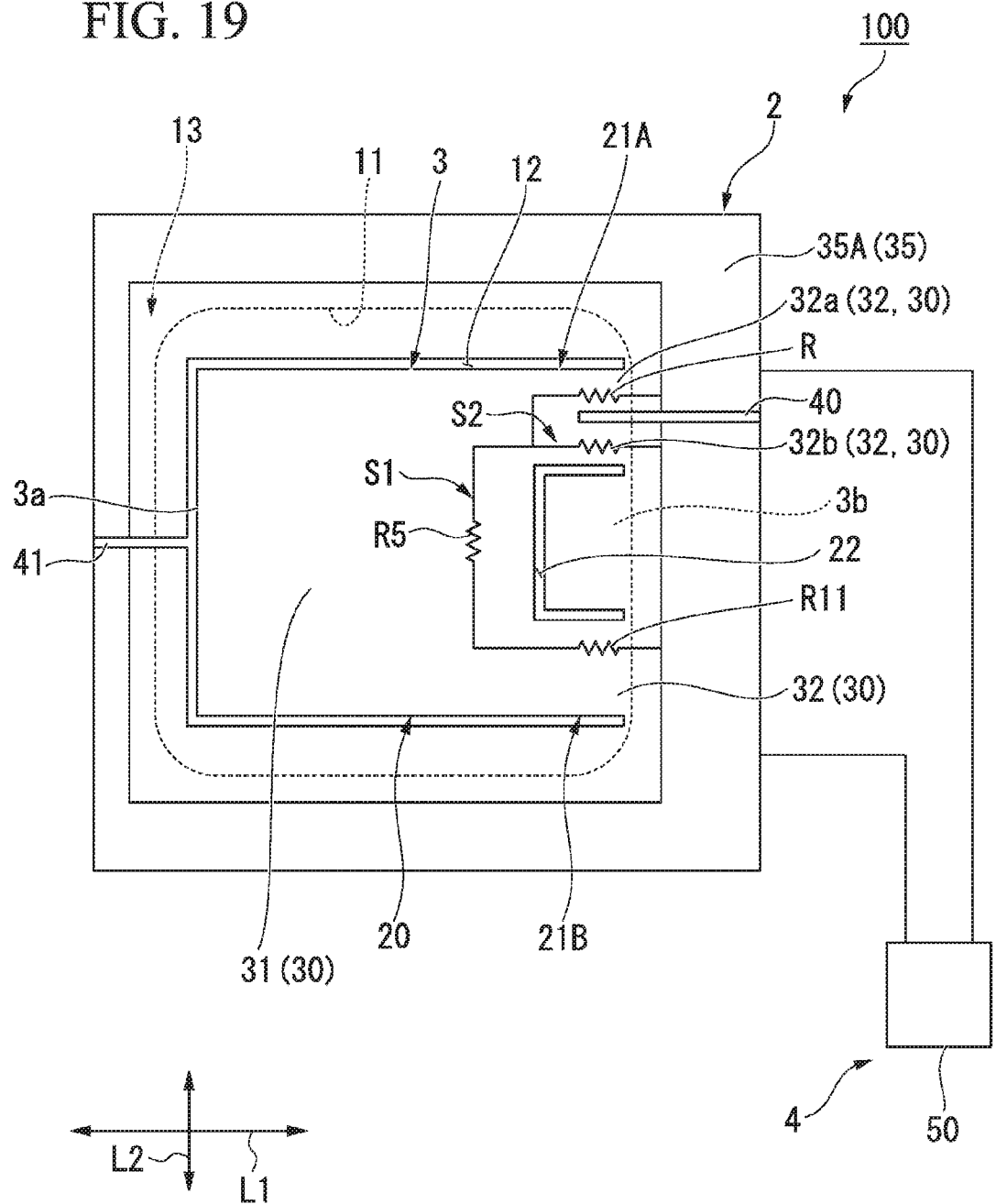
FIG. 19 is a connection circuit configuration view of respective resistances in the pressure sensor shown in FIG. 18.

As shown in FIG. 18, in a pressure sensor 100 of the present embodiment, the division groove 40 is formed in only the one lever support portion 21A, and the division groove 40 is not formed in the other lever support portion 21B. Accordingly, the one lever support portion 21A and the other lever support portion 21B do not have a common structure, and have an unsymmetrical structure.

Since the division groove 40 is formed in the one lever support portion 21A, the lever-resistance portion 32 is divided into the first resistance portion 32a which is electrically connected to the first detection electrode 35A in series and a second resistance portion 32b which is positioned to be close to the other lever support portion 21B by the division groove 40.

In contrast, since the division groove 40 is not formed in the other lever support portion 21B, the entire lever-resistance portion 32 is electrically connected to the second detection electrode 35B.

Moreover, since the division groove 40 is not formed in the other lever support portion 21B, the second resistance portion 32b in the one lever support portion 21A is electrically connected to the second detection electrode 35B.

Accordingly, if it is focused on the first resistance portion 32a in the one lever support portion 21A, the first resistance portion 32a is electrically connected to a portion between the first detection electrode 35A and the second detection electrode 35B via the parallel path of the first path S1 passing through the main body-resistance portion 31 and the lever-resistance portion 32 in the other lever support portion 21B, and the second path S2 passing through the second resistance portion 32b in the one lever support portion 21A.

Accordingly, the entire electric resistance value R between the first detection electrode 35A and the second detection electrode 35B is expressed by the following Expression 2. In addition, in Expression 2, R11 indicates the electric resistance value of the entire lever-resistance portion 32 in the other lever support portion 21B.

$$R = R1 + \frac{1}{\frac{1}{R2} + \frac{1}{R5 + R11}}$$ Expression 2

Similarly to the first embodiment, in the pressure sensor 100 having the above-described configuration, it is possible to increase sensitivity between the detection electrodes 35, and similar effects can be obtained.

Particularly, since the division groove 40 is not formed in the other lever support portion 21B, it is possible to increase the rigidity of the lever support portion 21B, and it is possible to stably bend the cantilever 3 over a long time period. Accordingly, it is possible to further improve reliability of the operation of the pressure sensor 100. In addition, since the division groove 40 is not formed in the other lever support portion 21B, it is possible to simplify the configuration, and the manufacturing process is easily performed. Accordingly, it is possible to increase a yield rate, and it is possible to improve manufacturing efficiency.

Seventh Embodiment

Next, a seventh embodiment according to the present invention will be described with reference to the drawings. In addition, in the seventh embodiment, the same reference numerals are assigned to the same components and portions as those of the sixth embodiment, and descriptions thereof are omitted.

Figure 20:
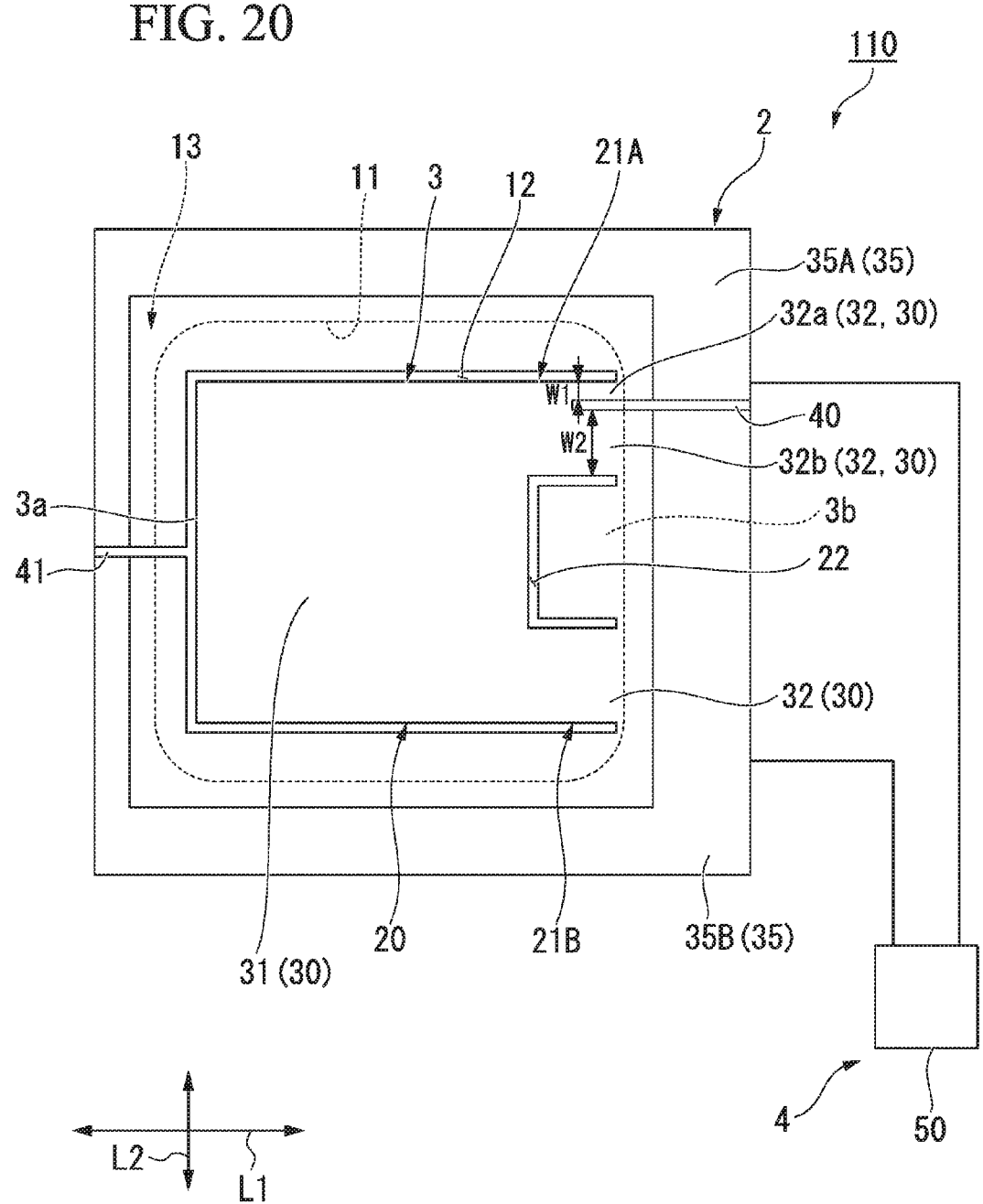
FIG. 20 is a view showing a seventh embodiment according to the present invention, and is a plan view of a pressure sensor.

As shown in FIG. 20, in a pressure sensor 110 of the present embodiment, the lever-resistance portion 32 is divided into the first resistance portion 32a and the second resistance portion 32b by the division groove 40 such that the first width W1 of the first resistance portion 32a is narrower than the second width W2 of the second resistance portion 32b in the one lever support portion 21A.

According to the pressure sensor 110 having the above-described configuration, similarly to the second embodiment, since the electric resistance value (R1) of the first resistance portion 32a is larger than the electric resistance value (R2) of the second resistance portion 32b, it is possible to further increase the resistance ratio of the first resistance portion 32a with respect to the entire resistance (electric resistance value R) between the first detection electrode 35A and the second detection electrode 35B. Accordingly, it is possible to decrease the influences of the main body-resistance portion 31 (R5), and it is possible to improve the sensitivity of the sensor.

Eighth Embodiment

Next, an eighth embodiment according to the present invention will be described with reference to the drawings. In addition, in the eighth embodiment, the same reference numerals are assigned to the same components and portions as those of the first embodiment, and descriptions thereof are omitted.

Figure 21:
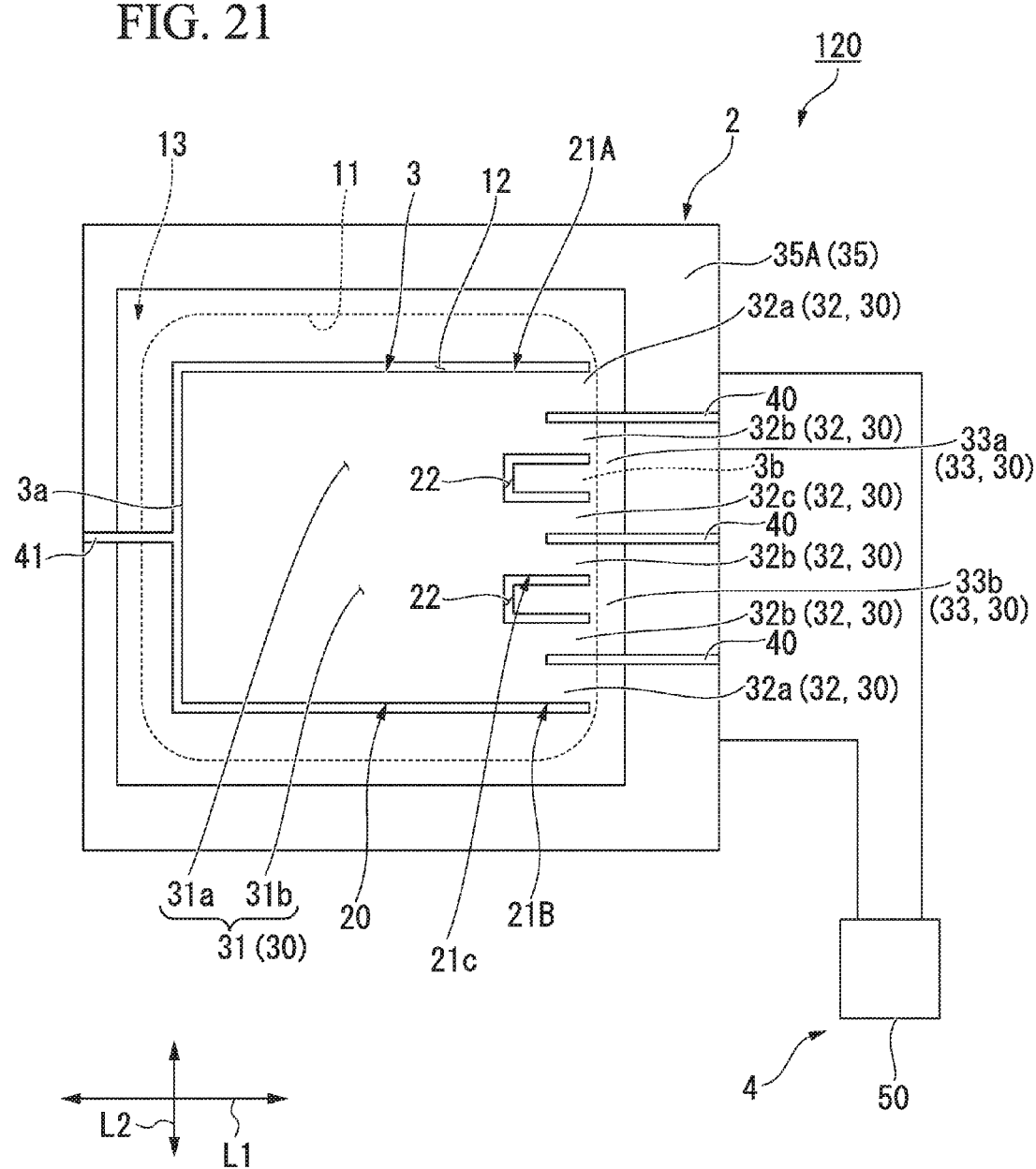
FIG. 21 is a view showing an eighth embodiment according to the present invention, and is a plan view of a pressure sensor.

As shown in FIG. 21, a pressure sensor 120 of the present embodiment includes one new lever support portion 21C in addition to the two lever support portions 21A and 21B, and includes a total of three lever support portions 21A, 21B, and 21C.

The new lever support portion 21C is disposed at the center portion of the cantilever 3 in the lateral direction L2. Accordingly, the lever support portion 21C is disposed between the lever support portion 21A and the lever support portion 21B.

In addition, two auxiliary gaps 22 are formed, and are respectively disposed between the new lever support portion 21C and the lever support portion 21A, and between the new lever support portion 21C and the lever support portion 21B. Accordingly, the three lever support portions 21A, 21B, and 21C are disposed so as to be arranged in one line in the lateral direction L2 in the state where the auxiliary gaps 22 are interposed therebetween. In addition, the support widths of the three lever support portions 21A, 21B, and 21C in the lateral direction L2 are the same as each other.

Similarly to the lever support portions 21A and 21B, the division groove 40 is formed in the new lever support portion 21C. Accordingly, the lever-resistance portion 32 in the new lever support portion 21C is divided into a third resistance portion 32c which is disposed to be close to the lever support portion 21A and a fourth resistance portion 32d which is disposed to be close to the lever support portion 21B by the division groove 40.

In addition, the division groove 40 formed in the new lever support portion 21C is formed to reach the side of the sensor main body 2 so as to divide the detection electrode 35 in the lateral direction L2. Accordingly, in the piezoresistance 30, the base end-resistance portion 33 which is formed between the lever support portions 21A and 21B is divided into a first base end-resistance portion 33a which is positioned to be close to the lever support portion 21A and a second base end-resistance portion 33b which is positioned to be close to the lever support portion 21B by the division groove 40.

Accordingly, the second resistance portion 32b in the lever support portion 21A is electrically connected to the third resistance portion 32c via the first base end-resistance portion 33a. Similarly, the second resistance portion 32b in the lever support portion 21B is electrically connected to the fourth resistance portion 32d via the second base end-resistance portion 33b.

In addition, the main body-resistance portion 31 of the present embodiment includes the first main body-resistance portion 31a and the second main body-resistance portion 31b according to the formation of the new lever support portion 21C.

The first main body-resistance portion 31a electrically connects the first resistance portion 32a in the lever support portion 21A and the third resistance portion 32c in the new lever support portion 21C. The second main body-resistance portion 31b electrically connects the first resistance portion 32a in the lever support portion 21B and the fourth resistance portion 32d in the new lever support portion 21C.

Figure 22:
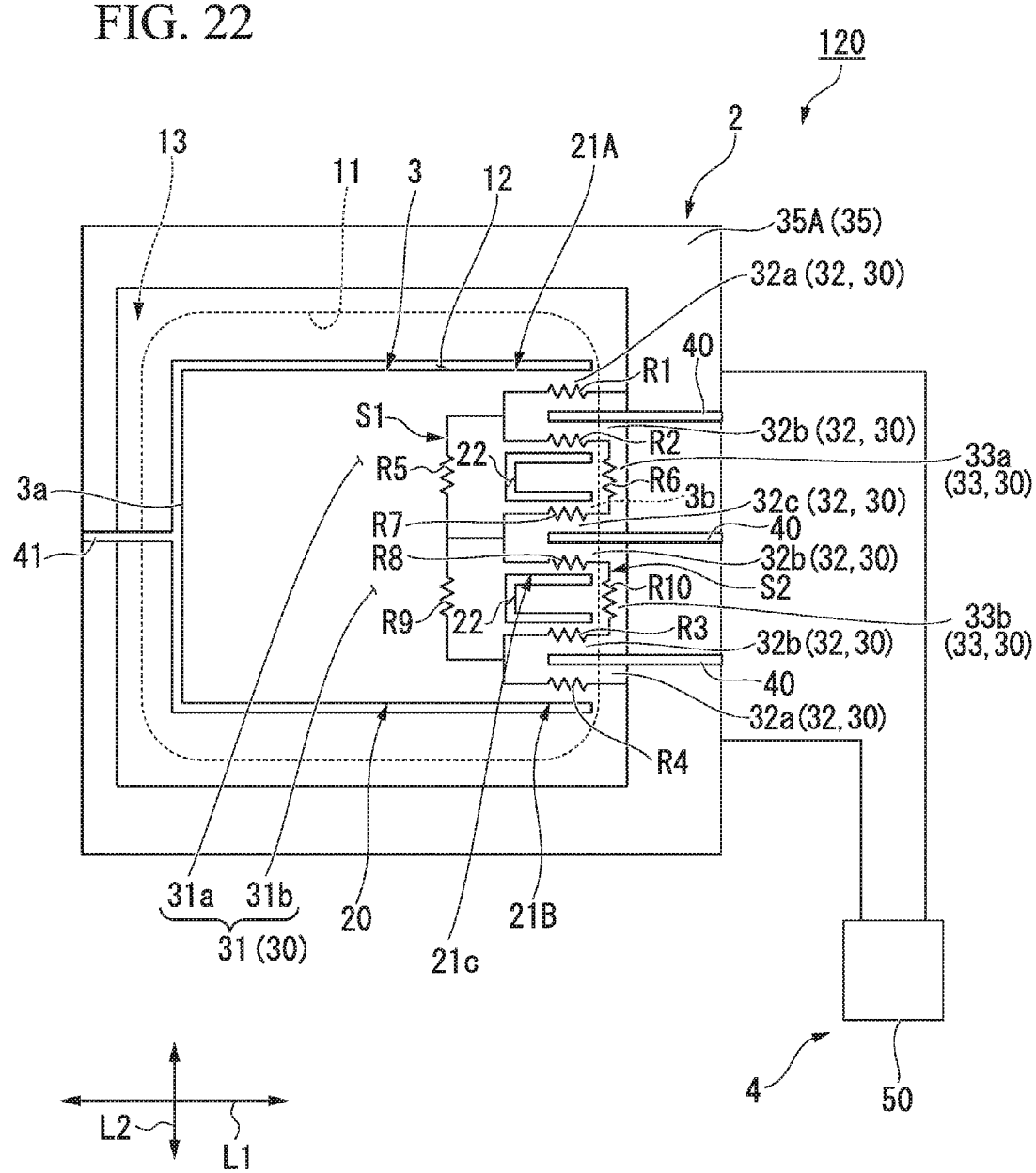
FIG. 22 is a connection circuit configuration view of respective resistances in the pressure sensor shown in FIG. 21.

Accordingly, as shown in FIG. 22, the pressure sensor 120 of the present embodiment includes a circuit configuration in which a parallel circuit which is formed between the lever support portion 21A and the new lever support portion 21C and a parallel circuit which is formed between the lever support portion 21B and the new lever support portion 21C are connected to each other in series.

That is, the first resistance portions 32a of the lever support portions 21A and 21B are electrically connected to each other by a parallel path of the first path S1 passing through the first main body-resistance portion 31a and the second main body-resistance portion 31b, and a second path S2 passing through the second resistance portion 32b, the first base end-resistance portion 33a, the third resistance portion 32c, the second base end-resistance portion 33b, and the fourth resistance portion 32d in the lever support portion 21A and passing through the second resistance portion 32b in the lever support portion 21B.

Accordingly, in the present embodiment, the entire electric resistance value R between the first detection electrode 35A and the second detection electrode 35B is expressed by the following Expression 3.

$$R = R1 + \cfrac{1}{\cfrac{1}{R5} + \cfrac{1}{R2+R6+R7}} + \cfrac{1}{\cfrac{1}{R9} + \cfrac{1}{R3+R8+R10}} + R4 \quad \text{Expression 3}$$

In addition, in Expression 3, R1 to R4 are similar to those of the first embodiment. R5 indicates the electric resistance value of the first main body-resistance portion 31a. R6 indicates the electric resistance value of the first base end-resistance portion 33a. R7 indicates the electric resistance value of the third resistance portion 32c. R8 indicates the electric resistance value of the fourth resistance portion 32d. R9 indicates the electric resistance value of the second main body-resistance portion 31b. R10 indicates the electric resistance value of the second base end-resistance portion 33b.

Compared to the first embodiment, according to the pressure sensor 120 having the above-described configuration, since the circuit configuration in which the parallel circuit is added is provided, it is possible to lengthen the path length of the first path S1 and the second path S2. Accordingly, it is possible to easily reduce power consumption without decreasing the sensitivity of the sensor.

Ninth Embodiment

Next, a ninth embodiment according to the present invention will be described with reference to the drawings. In addition, in the ninth embodiment, the same reference numerals are assigned to the same components and portions as those of the first embodiment, and descriptions thereof are omitted.

Figure 23:
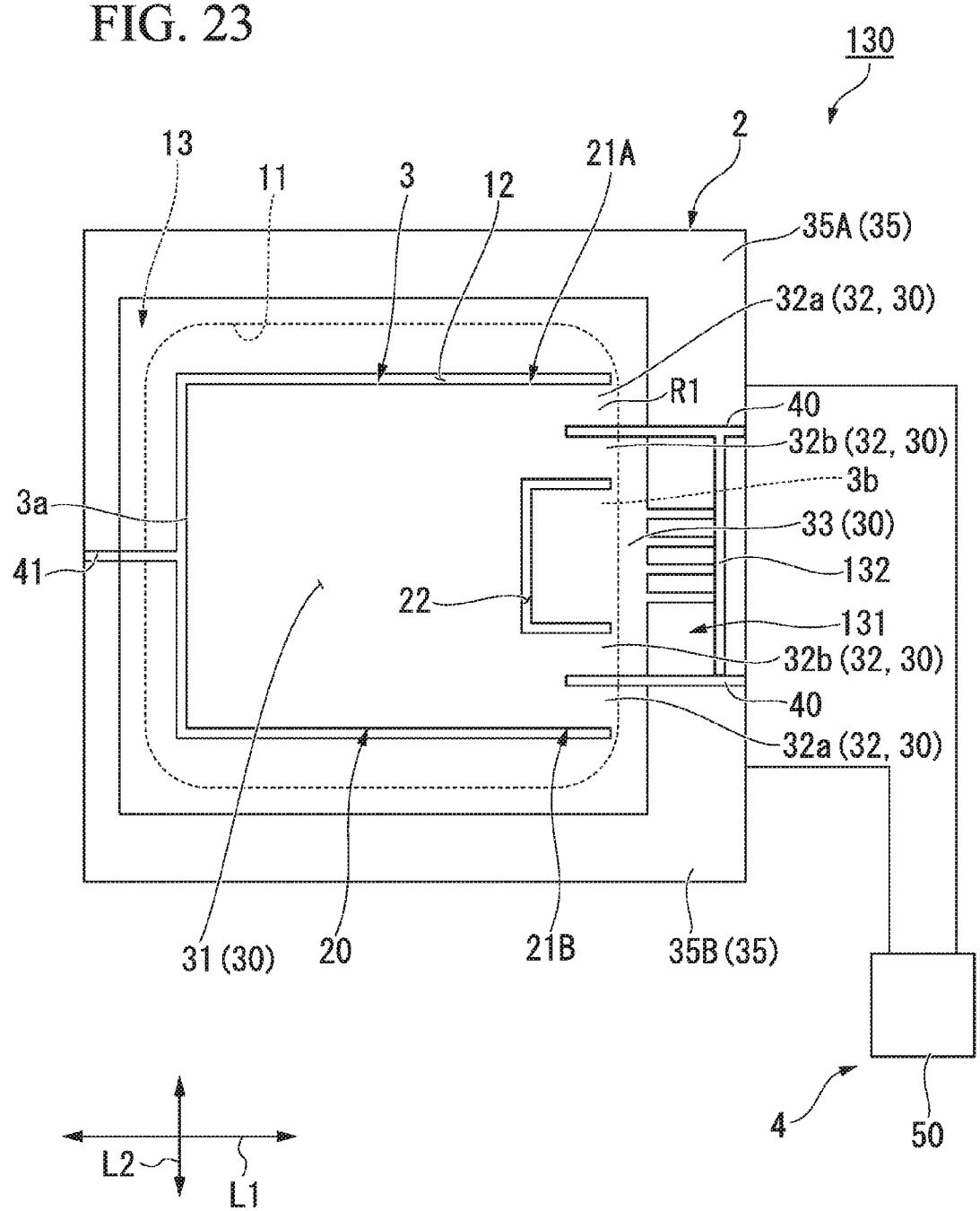
FIG. 23 is a view showing a ninth embodiment according to the present invention, and is a plan view of a pressure sensor.
Figure 24:
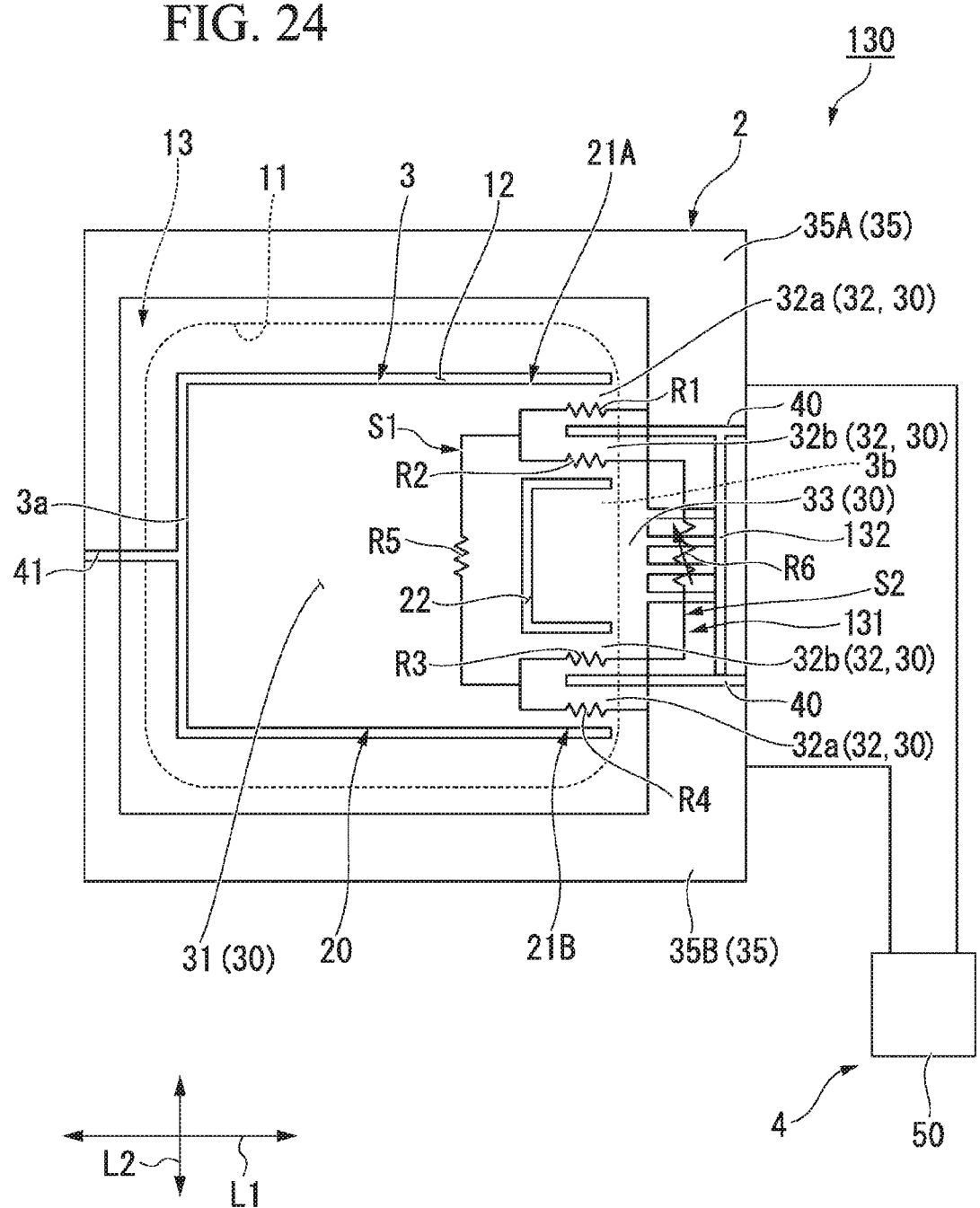
FIG. 24 is a connection circuit configuration view of respective resistances in the pressure sensor shown in FIG. 23.

As shown in FIGS. 23 and 24, a pressure sensor 130 of the present embodiment includes an adjustment film (resistance-adjustment portion) 131 which adjusts the resistance of the base end-resistance portion 33 which is positioned between the lever support portions 21A and 21B.

The adjustment film 131 is disposed between the lever support portion 21A and the lever support portion 21B on the base end portion 3b side of the cantilever 3, and becomes a portion of the detection electrode 35. For example, the adjustment film 131 is a film capable of trimming an arbitrary region by laser irradiation or the like.

If a voltage is applied to the portion between the first detection electrode 35A and the second detection electrode 35B, a current generated due to the applied voltage flows from the second resistance portion 32b of the lever support portion 21A to the second resistance portion 32b in the lever support portion 21B via the base end-resistance portion 33 which is a portion of the piezoresistance 30 and the adjustment film 131.

Accordingly, it is possible to change the ease of flow of the current flowing through the base end-resistance portion 33 by trimming the adjustment film 131, and as a result, it is possible to adjust the electric resistance value (R6) of the base end-resistance portion 33.

Accordingly, in the present embodiment, the entire electric resistance value R between the first detection electrode 35A and the second detection electrode 35B can be expressed by the following Expression 4, and it is possible to change the electric resistance value (R6) of the base end-resistance portion 33.

$$R = R1 + R4 + \cfrac{1}{\cfrac{1}{R5} + \cfrac{1}{R2+R3+R6}} \quad \text{Expression 4}$$

In addition, in the shown example, the adjustment film 131 is linearly trimmed at four locations at intervals in the lateral direction L2. In addition, in the sensor main body 2, a linear connection groove 132 which extends in the lateral direction L2 is formed so as to connect the division groove 40 formed in the lever support portion 21A and the division groove 40 formed in the lever support portion 21B. Accordingly, it is possible to set the range of the adjustment film 131 to a desired size. However, the connection groove 132 may not be formed.

According to the pressure sensor 130 having the above-described configuration, it is possible to adjust the electric resistance value (R6) of the base end-resistance portion 33 using the adjustment film 131, and it is possible to adjust the resistance ratio of the second resistance portion 32b which greatly contributes to the sensitivity. Therefore, for example, the adjustment is performed so as to increase the influences of the first resistance portion 32a which is electrically connected to the detection electrode 35 in series, the resistance ratio of the first resistance portion 32a with respect to the entire resistance (electric resistance value R) between the detection electrodes 35 increases, and it is possible to improve the sensitivity of the sensor. Alternatively, the adjustment is performed so as to increase the influences of the second resistance portion 32b, the entire sensitivity of the second path S2 increase, and it is possible to improve the entire sensitivity between the detection electrodes 35.

Accordingly, it is possible to adjust the entire electric resistance value R between the first resistance portions 32a which are electrically connected to each other by the parallel path of the first path S1 and the second path S2, and for example, it is possible to adjust not only the sensitivity but also balance with respect to the bridge circuit 51 included in the displacement detection unit 4.

In addition, for example, even in a case where the adjustment film 131 is slightly trimmed in a state where the doping concentration of the portion of the piezoresistance 30 corresponding to the base end-resistance portion 33 is changed in advance, it is possible to effectively adjust the electric resistance value (R6). Accordingly, it is possible to substantially enlarge the trimming possible range, and it is possible to easily adjust the resistance value in a wider range.

In addition, the above-described embodiments are exemplified and do not limit the claims. The embodiments can be variously embodied, and various omissions, replacements, and modifications can be applied to the embodiments within a scope which does not depart from the gist of the present invention.

The embodiments or modifications thereof are included in the scope of the invention or the gist thereof, and are included in the invention disclosed in the claims and the scope equivalent to the claims.

Moreover, in each embodiment, the example in which the cantilever 3 includes the two lever support portions 21A and 21B is described. However, the number of the lever support portions 21A and 21B is not limited to two, and like the eighth embodiment, three lever support portions may be provided, and a plurality of (for example, four, six, or the like) lever support portions may be provided.

Particularly, in the case where the number of lever support portions is even number of four or more, the first resistance portions can be configured so as to be electrically connected by two parallel paths of the first path and the second path in at least the lever support portions adjacent to each other.

INDUSTRIAL APPLICABILITY

According to the present invention, it is possible to accurately detect variation in pressures, and it is possible to sensitively detect the variation in pressures. Accordingly, industrial applicability can be realized.

REFERENCE SIGNS LIST

S1: first path
S2: second path
W1: first width
W2: second width
1, 60, 70, 80, 90, 100, 110, 120, 130: pressure sensor
2: sensor main body
3: cantilever
4: displacement detection unit
10: cavity
11: communication opening
20: lever main body
21A, 21B: lever support portion
31: main body-resistance portion
32: lever-resistance portion
32a: first resistance portion
32b: second resistance portion
33: base end-resistance portion
35: detection electrode
40: division groove (division portion)
71: conductor
81: groove portion (resistance-increase portion)
82: undoped portion (resistance-increase portion)
92: piezoresistance (reference-resistance portion)
93: reference portion
131: adjustment film (resistance-adjustment portion)

The invention claimed is:

1. A pressure sensor, comprising:
a hollow sensor main body having a cavity formed therein and having a communication opening through which the inside and the outside of the cavity communicate with each other;
a cantilever having a lever main body and a plurality of lever support portions which connect the lever main body and the sensor main body and support the lever main body in a cantilever state, is disposed so as to cover the communication opening, and is bent according to a pressure difference between the cavity and the outside of the sensor main body; and
a displacement detection unit having a detection electrode formed on the sensor main body, a main body-resistance portion formed on the lever main body, and a lever-resistance portion formed on the lever support portion, and detects displacement of the cantilever based on resistance variation in resistance values of the main body-resistance portion and the lever-resistance portion,
wherein a division portion is formed at the lever support portion, and the division portion divides the lever-resistance portion into a first resistance portion which is electrically connected to the detection electrode in series and a second resistance portion which is positioned so as to be closer to the other adjacent lever support portion than the first resistance portion, and electrically separates the first resistance portion and the second resistance portion from each other, and
wherein the first resistance portion is electrically connected to the detection electrode via a parallel path of a first path passing through the main body-resistance portion and a second path passing through the second resistance portion.

2. The pressure sensor according to claim 1,
wherein the division portion is formed in each of the adjacent lever support portions, and
wherein the first resistance portions of the adjacent lever support portions are electrically connected to the detection electrode in a state of being electrically connected to each other by the parallel path of the first path passing through the main body-resistance portion and the second path passing through the second resistance portion and the base end portion side of the cantilever.

3. The pressure sensor according to claim 1,
wherein the division portion divides the first resistance portion and the second resistance portion such that a first width of the first resistance portion along a support width of the lever support portion is narrower than a second width of the second resistance portion along a support width of the lever support portion.

4. The pressure sensor according to claim 1, wherein the division portion is a groove-shaped division groove which is formed at the lever-resistance portion.

5. The pressure sensor according to claim 1, wherein a conductor having electric resistivity which is smaller than that of the first resistance portion is formed at the second resistance portion.

6. The pressure sensor according to claim 1, wherein a resistance-increase portion which increases a resistance of the main body-resistance portion is formed at the main body-resistance portion.

7. The pressure sensor according to claim 6, wherein the resistance-increase portion is a groove-shaped groove portion which is formed at the main body-resistance portion and is formed so as to increase a transmission distance of a current which flows through the main body-resistance portion.

8. The pressure sensor according to claim 6, wherein the resistance-increase portion is a groove-shaped groove portion which is formed at the main body-resistance portion and is formed so as to interrupt a flow of a current which flows through the main body-resistance portion.

9. The pressure sensor according to claim 6, wherein the resistance-increase portion is an insulation layer.

10. The pressure sensor according to claim 1, wherein a base end-resistance portion which is formed between the adjacent lever support portions and a resistance-adjustment portion which adjusts a resistance of the base end-resistance portion are provided at the base end portion of the cantilever.

11. The pressure sensor according to claim 1, further comprising:
a reference portion which is disposed so as to be exposed to the outside of the sensor main body and having a reference-resistance portion is formed,
wherein the displacement detection unit detects displacement of the cantilever based on a difference between the resistance variation in resistance values of the main body-resistance portion and the lever-resistance portion and the resistance variation in resistance values of the reference-resistance portion.

* * * * *